United States Patent
Manipatruni et al.

(10) Patent No.: US 12,062,584 B1
(45) Date of Patent: Aug. 13, 2024

(54) ITERATIVE METHOD OF MULTILAYER STACK DEVELOPMENT FOR DEVICE APPLICATIONS

(71) Applicant: Kepler Computing Inc., San Francisco, CA (US)

(72) Inventors: Sasikanth Manipatruni, Portland, OR (US); Niloy Mukherjee, San Ramon, CA (US); Noriyuki Sato, Palo Alto, CA (US); Tanay Gosavi, Portland, OR (US); Mauricio Manfrini, Heverlee (BE); Somilkumar J. Rathi, San Jose, CA (US); James David Clarkson, El Sobrante, CA (US); Rajeev Kumar Dokania, Beaverton, OR (US); Debo Olaosebikan, San Francisco, CA (US); Amrita Mathuriya, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 0 days.

(21) Appl. No.: 17/976,689

(22) Filed: Oct. 28, 2022

(51) Int. Cl.
  *H01L 21/66* (2006.01)
  *H10B 51/30* (2023.01)
  *H10B 53/30* (2023.01)

(52) U.S. Cl.
  CPC ............ *H01L 22/20* (2013.01); *H10B 51/30* (2023.02); *H10B 53/30* (2023.02)

(58) Field of Classification Search
  CPC ......... H01L 22/20; H01B 51/30; H10B 53/30; H10B 51/30
  See application file for complete search history.

(56) References Cited

U.S. PATENT DOCUMENTS

| | | |
|---|---|---|
| 5,086,412 A | 2/1992 | Jaffe et al. |
| 5,383,150 A | 1/1995 | Nakamura et al. |
| (Continued) | | |

FOREIGN PATENT DOCUMENTS

| | | |
|---|---|---|
| JP | H10255484 A | 9/1998 |
| JP | H11292626 A | 10/1999 |
| (Continued) | | |

OTHER PUBLICATIONS

Li et al., "Effect of Annealing on Ferroelectric Properties of Nanometre baTiO3 Ceramics Prepared by High Pressure Sintering Method," Chins. Phys. Lett. vol. 24, No. 1 (2007), pp. 244-247.

(Continued)

*Primary Examiner* — Jay C Kim
(74) *Attorney, Agent, or Firm* — MUGHAL GAUDRY & FRANKLIN PC

(57) ABSTRACT

A method to deposit a multi-layer stack for device applications includes implementing a model driven target selection for deposition. One or more targets may be procured with an initial stoichiometric composition or elemental purity. The targets may be utilized to form the multi-layer stack, and measurements may be made of chemical composition and electrical properties of the multi-layer stack. The measurements may be compared to reference target values and if measurement results are not within tolerance, the composition of the targets can be changed to yield a successive multi-layer stack. The process can be iterated until measurement results are within tolerance of target results. Additional experimentation with post deposition thermal anneal can be performed to optimize multi-layer stack properties.

12 Claims, 11 Drawing Sheets

(56) References Cited

U.S. PATENT DOCUMENTS

| | | | |
|---|---|---|---|
| 5,539,279 A | 7/1996 | Takeuchi et al. |
| 5,739,563 A | 4/1998 | Kawakubo et al. |
| 5,796,079 A | 8/1998 | Kim et al. |
| 6,002,608 A | 12/1999 | Tanabe |
| 6,043,526 A | 3/2000 | Ochiai |
| 6,274,388 B1 | 8/2001 | Aggarwal et al. |
| 6,346,741 B1 | 2/2002 | Buskirk et al. |
| 6,368,910 B1 | 4/2002 | Sheu et al. |
| 6,388,281 B1 | 5/2002 | Jung et al. |
| 6,500,678 B1 | 12/2002 | Aggarwal et al. |
| 6,587,367 B1 | 7/2003 | Nishimura et al. |
| 6,643,163 B2 | 11/2003 | Takashima |
| 6,656,301 B2 | 12/2003 | Kirby |
| 6,656,748 B2 | 12/2003 | Hall et al. |
| 6,713,342 B2 | 3/2004 | Celii et al. |
| 6,717,838 B2 | 4/2004 | Hosoi |
| 6,720,600 B2 | 4/2004 | Okita |
| 6,728,128 B2 | 4/2004 | Nishimura et al. |
| 6,798,686 B2 | 9/2004 | Takashima |
| 6,906,944 B2 | 6/2005 | Takeuchi et al. |
| 7,029,925 B2 | 4/2006 | Celii et al. |
| 7,075,134 B2 | 7/2006 | Araujo et al. |
| 7,169,621 B2 | 1/2007 | Hasegawa et al. |
| 7,173,844 B2 | 2/2007 | Lee et al. |
| 7,354,504 B2 * | 4/2008 | Wilson | H05B 6/705 204/157.43 |
| 7,405,959 B2 | 7/2008 | Koide et al. |
| 7,426,130 B2 | 9/2008 | Jeon |
| 7,673,278 B2 * | 3/2010 | Rathsack | H01L 22/20 716/56 |
| 7,791,922 B2 | 9/2010 | Doumae et al. |
| 7,857,946 B2 * | 12/2010 | Kitano | C23C 14/16 204/298.18 |
| 7,867,847 B2 * | 1/2011 | Kitano | H01L 29/7881 438/785 |
| 7,894,927 B2 * | 2/2011 | Funk | H01L 22/12 703/2 |
| 8,030,694 B2 * | 10/2011 | Nakagawa | H01L 29/40117 257/295 |
| 8,082,536 B2 * | 12/2011 | Fukuda | H01L 22/12 700/121 |
| 8,108,805 B2 * | 1/2012 | Rathsack | G03F 7/705 700/121 |
| 8,232,189 B2 * | 7/2012 | Ono | H01L 29/517 257/532 |
| 8,300,446 B2 | 10/2012 | Qidwai |
| 8,441,833 B2 | 5/2013 | Summerfelt et al. |
| 8,665,628 B2 | 3/2014 | Kawashima |
| 8,828,194 B2 | 9/2014 | Fiukowski et al. |
| 8,865,628 B2 | 10/2014 | Manabe et al. |
| 9,472,560 B2 | 10/2016 | Ramaswamy et al. |
| 9,786,348 B1 | 10/2017 | Kawamura et al. |
| 9,812,204 B1 | 11/2017 | Yan et al. |
| 10,847,201 B2 | 11/2020 | Manipatruni et al. |
| 10,998,025 B2 | 5/2021 | Manipatruni et al. |
| 11,423,967 B1 | 8/2022 | Dokania et al. |
| 11,482,270 B1 | 10/2022 | Dokania et al. |
| 11,659,714 B1 * | 5/2023 | Mukherjee | H10B 51/40 257/295 |
| 2002/0079520 A1 | 6/2002 | Nishihara et al. |
| 2002/0125517 A1 | 9/2002 | Nakamura |
| 2002/0153550 A1 | 10/2002 | An et al. |
| 2003/0119211 A1 | 6/2003 | Summerfelt et al. |
| 2003/0129847 A1 | 7/2003 | Celii et al. |
| 2003/0141528 A1 | 7/2003 | Ito |
| 2004/0027873 A1 | 2/2004 | Nishihara |
| 2004/0043522 A1 | 3/2004 | Hikosaka |
| 2004/0063226 A1 | 4/2004 | Bajt et al. |
| 2004/0104754 A1 | 6/2004 | Bruchhaus et al. |
| 2004/0129961 A1 | 7/2004 | Araujo et al. |
| 2004/0233696 A1 | 11/2004 | Kang |
| 2004/0245547 A1 | 12/2004 | Stipe |
| 2005/0012126 A1 | 1/2005 | Udayakumar et al. |
| 2005/0214954 A1 | 9/2005 | Maruyama et al. |
| 2005/0230725 A1 | 10/2005 | Aggarwal et al. |
| 2005/0244988 A1 | 11/2005 | Wang et al. |
| 2006/0001070 A1 | 1/2006 | Park et al. |
| 2006/0002170 A1 | 1/2006 | Kumura et al. |
| 2006/0006447 A1 | 1/2006 | Kim et al. |
| 2006/0073613 A1 | 4/2006 | Aggarwal et al. |
| 2006/0073614 A1 | 4/2006 | Hara |
| 2006/0134808 A1 | 6/2006 | Summerfelt et al. |
| 2006/0138507 A1 | 6/2006 | Kijima et al. |
| 2006/0258113 A1 | 11/2006 | Sandhu et al. |
| 2007/0275484 A1 | 11/2007 | Mitsui |
| 2007/0298521 A1 | 12/2007 | Obeng et al. |
| 2008/0073680 A1 | 3/2008 | Wang |
| 2008/0081380 A1 | 4/2008 | Celii et al. |
| 2008/0101107 A1 | 5/2008 | Shiga et al. |
| 2008/0107885 A1 | 5/2008 | Alpay et al. |
| 2008/0191252 A1 | 8/2008 | Nakamura et al. |
| 2009/0003042 A1 | 1/2009 | Lee et al. |
| 2009/0290401 A1 | 11/2009 | Ouyang et al. |
| 2010/0041232 A1 | 2/2010 | Summerfelt et al. |
| 2010/0068831 A1 * | 3/2010 | Barber | H03H 9/175 257/E21.531 |
| 2012/0127776 A1 | 5/2012 | Kawashima |
| 2012/0134196 A1 | 5/2012 | Evans, Jr. et al. |
| 2012/0313218 A1 | 12/2012 | Fujimori et al. |
| 2014/0208041 A1 | 7/2014 | Hyde et al. |
| 2014/0247642 A1 | 9/2014 | Madhan et al. |
| 2015/0004718 A1 | 1/2015 | Sun et al. |
| 2015/0069481 A1 | 3/2015 | Sun et al. |
| 2015/0294702 A1 | 10/2015 | Lee et al. |
| 2017/0277459 A1 | 9/2017 | Rodriguez et al. |
| 2018/0166453 A1 | 6/2018 | Müller |
| 2018/0226418 A1 | 8/2018 | Morandi et al. |
| 2018/0245197 A1 | 8/2018 | Singh et al. |
| 2018/0286971 A1 | 10/2018 | Lee et al. |
| 2018/0323309 A1 | 11/2018 | Ando et al. |
| 2019/0051642 A1 | 2/2019 | Hyde et al. |
| 2019/0051815 A1 | 2/2019 | Kakinuma et al. |
| 2019/0115353 A1 | 4/2019 | O'Brien et al. |
| 2019/0127845 A1 | 5/2019 | Shuto et al. |
| 2019/0138893 A1 | 5/2019 | Sharma et al. |
| 2020/0004583 A1 | 1/2020 | Kelly et al. |
| 2020/0051607 A1 | 2/2020 | Pan et al. |
| 2020/0273867 A1 | 8/2020 | Manipatruni et al. |
| 2020/0357453 A1 | 11/2020 | Slesazeck et al. |
| 2021/0063329 A1 | 3/2021 | Kuznetsov et al. |
| 2021/0090662 A1 | 3/2021 | Mennenga et al. |
| 2021/0111179 A1 | 4/2021 | Shivaraman et al. |
| 2021/0142837 A1 | 5/2021 | Yu et al. |
| 2021/0193209 A1 | 6/2021 | Swami et al. |
| 2021/0202689 A1 | 7/2021 | Thareja et al. |
| 2021/0240896 A1 | 8/2021 | Ayyagari et al. |
| 2021/0398580 A1 | 12/2021 | Yuh |

FOREIGN PATENT DOCUMENTS

| | | |
|---|---|---|
| JP | 2003123465 A | 4/2003 |
| JP | 2005057103 A | 3/2005 |
| KR | 100481867 B1 | 4/2005 |
| KR | 20050105695 A | 11/2005 |
| KR | 100895740 B1 | 4/2009 |
| TW | 200718237 A | 5/2007 |
| TW | 200935151 A | 8/2009 |
| TW | 201725736 A | 7/2017 |
| WO | 2004050944 A2 | 6/2004 |
| WO | 20130147295 | 10/2013 |
| WO | 2015167887 A1 | 11/2015 |
| WO | 2021112247 A1 | 6/2021 |

OTHER PUBLICATIONS

Advisory Action notified Jul. 25, 2022 for U.S. Appl. No. 17/339,850.
Advisory Action notified Nov. 16, 2021 for U.S. Appl. No. 16/287,953.
Advisory Action notified Nov. 16, 2021 for U.S. Appl. No. 16/288,004.
Advisory Action notified Nov. 16, 2021 for U.S. Appl. No. 16/288,006.
Chandler, T. "An adaptive reference generation scheme for 1T1C FeRAMs", 2003 Symposium on VLSI Circuits. Digest of Technical

(56) References Cited

OTHER PUBLICATIONS

Papers (IEEE Cat. No. 03CH37408), Kyoto, Japan, 2003, pp. 173-174.
Final Office Action notified Apr. 25, 2022 for U.S. Appl. No. 16/287,953.
Final Office Action notified Aug. 15, 2022 for U.S. Appl. No. 17/346,083.
Final Office Action notified Jun. 13, 2022 for U.S. Appl. No. 17/339,850.
Final Office Action notified May 11, 2022 for U.S. Appl. No. 16/288,004.
Final Office Action notified May 11, 2022 for U.S. Appl. No. 16/288,006.
Final Office Action notified Oct. 7, 2021 for U.S. Appl. No. 16/287,953.
Final Office Action notified Oct. 7, 2021 for U.S. Appl. No. 16/288,004.
Final Office Action notified Oct. 7, 2021 for U.S. Appl. No. 16/288,006.
Final Office Action notified Sep. 12, 2022 for U.S. Appl. No. 17/367,217.
Fu et al., "Understanding the Microwave Annealing of Silicon," AIP Advances 7, 035214 (2017); https://doi.org/10.1063/1.4978912; Published Mar. 15, 2017, (8 pages).
Gudmundsson et al., "Foundations of Physical Vapor Deposition with Plasma Assistance," Plasma Sources Sci. Technol. 31 (2022) 083001; https://doi.org/10.1088/1361-6595/ac7f53; pp. 1-33 (34 pages).
Gupta et al., "Buried Power Rail Integration with Si FinFETs for CMOS Scaling beyond the 5 nm Node," 2020 IEEE Symposium on VLSI Technology, Jun. 16-19, 2020, Honolulu, HI, US. 2 pages. DOI: 10.1109/VLSITechnology18217.2020.9265113.
Gupta et al., "Buried Power Rail Scaling and Metal Assessment for the 3 nm Node and Beyond," 2020 IEEE International Electron Devices Meeting (IEDM), Dec. 12-18, 2020, San Francisco, CA, US. 4 pages. DOI: 10.1109/IEDM13553.2020.9371970.
International Preliminary Report on Patentability notified Sep. 10, 2021 for PCT Patent Application No. PCT/US2020/018870.
International Preliminary Report on Patentability notified Sep. 10, 2021 for PCT Patent Application No. PCT/US2020/066963.
International Search Report & Written Opinion notified Jun. 19, 2020 for U.S. Patent Application No. PCT/US2020/018879.
International Search Report & Written Opinion notified Jun. 24, 2020 for PCT Patent Application No. PCT/US2020/018870.
Josefson "Evaluation of Ferroelectric Materials for Memory Applications," Thesis Collection, Dudley Knox Library, Monterey, CA; http://hdl.handle.net/10945/27767, Jun. 1990; (99 pages).
Juan et al., "Electrical Characterization of Metal-Ferroelectric (Mn-substituted BiFeO3)-Insulator (HfO2)-Semiconductor Capacitors for Nonvolatile Memory Applications," Microelectronic Engineering 86, 2009. pp. 1845-1848.
Jung, D. et al., "Highly manufacturable 1T1C 4 Mb FRAM with novel sensing scheme," International Electron Devices Meeting 1999. Technical Digest (Cat. No. 99CH36318), Washington, DC, USA, 1999, pp. 279-282., International Electron Devices Meeting 1999. Technical Digest (Cat. No. 99CH36318), Washington, DC, USA, 1999, pp. 279-282.
Khanal et al. "Grain-Size Dependence of Piezoelectric Properties in Thermally Annealed BaTiO3 Ceramics," Journal of the Ceramic Society of Japan 126 (7) pp. 536-541 2018. http://doi.org/10.2109/jcersj2.17260.
Kim et al., "Application of Ferroelectric Materials for Improving Output Power of Energy Harvesters," Nano Convergence (2018) 5:30; https://doi.org/10.1186/s40580-018-0163-0; (16 pages).
Kossar et al., "Ferroelectric Polarization Induced Memristive Behavior in Bismugh Ferrite (BiFeO3) Based Memory Devices," Superlattices and Microstructures 148 (2020) 106726. 14 pages.
Lin et al., "Metal-Ferroelectric (BiFeO3)-Insulator(Y2O3)-Semiconductor Capacitors and Field Effect Transistors for nonvolatile Memory Applications," Appl. Phys. Lett. 64, 142908 (2009); https://doi.org/10.1063/1.3114403.
Lou et al., "Local Phase Decomposition as a Cause of Polarization Fatigue in Ferroelectric Thin Films," Physical Review Letters, PRL 97, 177601 (2006); DOI: 10.1103/PhysRevLett.97.177601; (4 pages).
Machado et al., "Band Gap Tuning of Solution-Processed Ferroelectric Perovskite BiFe1—XCoxO3 Thin Films," Chem. Mater. 2019, 31. pp. 947-954.
Mathur et al., "Buried Bitline for sub-5nm SRAM Design," 2020 IEEE International Electron Devices Meeting (IEDM), San Francisco, CA, US. 4 pages. DOI: 10.1109/IEDM13553.2020.9372042.
McGovern et al., "Grain Size Influences Activation Energy and Migration Pathways in MAPbBr3 Perovskite Solar Cells," Journal Phys. Chem. Kett. 2021, 12. pp. 2423-2428.
Noguchi et al., "Ferroelectrics with a Controlled Oxygen-Vacancy Distribution by Design," Scientific Reports 9:4225; Published Mar. 12, 2019; https://doi.org/10.1038/s41598-019-40717-0; www.nature.com/scientificreports. pp. 1-10 (10 pages).
Non-Final Office Action notified Aug. 5, 2020 for U.S. Appl. No. 16/287,953.
Non-Final Office Action notified Aug. 5, 2020 for U.S. Appl. No. 16/288,004.
Non-Final Office Action notified Aug. 5, 2020 for U.S. Appl. No. 16/288,006.
Non-Final Office Action notified Aug. 16, 2022 for U.S. Appl. No. 17/367,217.
Non-Final Office Action notified Dec. 20, 2021 for U.S. Appl. No. 16/288,004.
Non-Final Office Action notified Jan. 18, 2022 for U.S. Appl. No. 16/287,953.
Non-Final Office Action notified Jan. 19, 2022 for U.S. Appl. No. 16/288,006.
Non-Final Office Action notified Jun. 13, 2022 for U.S. Appl. No. 17/346,083.
Non-Final Office Action notified Jun. 15, 2022 for U.S. Appl. No. 17/367,101.
Non-Final Office Action notified Jun. 26, 2020 for U.S. Appl. No. 16/287,876.
Non-Final Office Action notified Jun. 27, 2022 for U.S. Appl. No. 17/315,143.
Non-Final Office Action notified Mar. 7, 2022 for U.S. Appl. No. 17/339,850.
Non-Final Office Action notified Mar. 30, 2022 for U.S. Appl. No. 17/346,083.
Non-Final Office Action notified Mar. 31, 2022 for U.S. Appl. No. 17/346,087.
Non-Final Office Action notified Nov. 4, 2022 for U.S. Appl. No. 17/530,362.
Non-Final Office Action notified Nov. 21, 2022 for U.S. Appl. No. 7/532,657.
Non-Final Office Action notified Oct. 12, 2022 for U.S. Appl. No. 17/530,365.
Non-Final Office Action notified Oct. 26, 2022 for U.S. Appl. No. 17/531,577.
Non-Final Office Action notified Sep. 1, 2022 for U.S. Appl. No. 17/339,850.
Non-Final Office Action notified Sep. 2, 2022 for U.S. Appl. No. 17/315,139.
Non-Final Office Action notified Sep. 7, 2022 for U.S. Appl. No. 17/530,360.
Non-Final Office Action notified Sep. 15, 2022 for U.S. Appl. No. 17/315,111.
Notice of Allowance notified Apr. 20, 2022 for U.S. Appl. No. 17/359,311.
Notice of Allowance notified Aug. 8, 2022 for U.S. Appl. No. 17/529,258.
Notice of Allowance notified Aug. 17, 2022 for U.S. Appl. No. 17/346,087.
Notice of Allowance notified Aug. 22, 2022 for U.S. Appl. No. 7/390,791.
Notice of Allowance notified Aug. 25, 2022 for U.S. Appl. No. 17/367,101.

(56) References Cited

OTHER PUBLICATIONS

Notice of Allowance notified Aug. 31, 2022 for U.S. Appl. No. 17/359,325.
Notice of Allowance notified Jan. 12, 2021 for U.S. Appl. No. 16/287,876.
Notice of Allowance notified Jul. 27, 2020 for U.S. Appl. No. 16/287,927.
Notice of Allowance notified Jun. 9, 2022 for U.S. Appl. No. 16/288,006.
Notice of Allowance notified Jun. 10, 2022 for U.S. Appl. No. 16/288,004.
Notice of Allowance notified Jun. 13, 2022 for U.S. Appl. No. 16/287,953.
Notice of Allowance notified Jun. 15, 2022 for U.S. Appl. No. 17/367,083.
Notice of Allowance notified Jun. 23, 2022 for U.S. Appl. No. 17/367,172.
Notice of Allowance notified Jun. 23, 2022 for U.S. Appl. No. 17/367,210.
Notice of Allowance notified Nov. 9, 2022 for U.S. Appl. No. 17/390,831.
Notice of Allowance notified Nov. 17, 2022 for U.S. Appl. No. 17/530,363.
Notice of Allowance notified Oct. 20, 2022 for Taiwan Patent Application No. 110129115.
Notice of Allowance notified Sep. 13, 2022 for U.S. Appl. No. 17/530,364.
Notice of Allowance notified Sep. 14, 2022 for U.S. Appl. No. 17/530,360.
Notice of Allowance notified Sep. 21, 2022 for U.S. Appl. No. 17/530,366.
Notice of Allowance notified Sep. 23, 2022 for U.S. Appl. No. 17/339,850.
Notice of Allowance notified Sep. 26, 2022 for U.S. Appl. No. 17/367,217.
Notice of Allowance notified Sep. 27, 2022 for U.S. Appl. No. 17/346,083.
Notice of Preliminary Rejection notified Oct. 28, 2022 for Korean Patent Application No. 10-2021-7027303.
Ogiwara, R. et al., "A 0.5-/spl mu/m, 3-V 1T1C, 1-Mbit FRAM with a variable reference bit-line voltage scheme using a fatigue-free reference capacitor", in IEEE Journal of Solid-State Circuits, vol. 35, No. 4, pp. 545-551, Apr. 2000.
Oh, S. et al. "Noble FeRAM technologies with MTP cell structure and BLT ferroelectric capacitors", IEEE International Electron Devices Meeting 2003, Washington, DC, USA, 2003, pp. 34.5.1-34.5.4.
Pan et al.,"Giant Energy Density and High Efficiency Achieved in Bismuth Ferrite-Based Film Capacitors Via Domain Engineering," Nature Communications 2018, 9:1813, 8 pages, DOI: 10.1038/s41467-018-04189-6.
Pandey, "Memory Improvement in Lead-Free BiFeO3 Ferroelectric with High-K Al2)e Buffer Layer for Non-Volatile Memory Applications," Applied Physics A (2018) 124:507, 8 pages. https://doi.org/10.1007/s00339-018-1926-5.
Pesic et al., "Comparative Study of Reliability of Ferroelectric and Anti-Ferroelectric Memories," IEEE Transactions on Device and Materials Reliability, vol. 18, No. 2, Jun. 2018. pp. 154-162 (9 pages).
Pesic et al., "How to Make DRAM Non-Volatile? Anti-Ferroelectrics: A New Paradigm for Universal Memories," 2016 IEEE International Electron Devices Meeting (IEDM). pp. 1161-1164 (4 pages).
Pham "Atomic Layer Deposition Enabled Synthesis of multiferroic Nanostructures," 2015 Thesis/dissertation, University of California, Los Angeles. 238 pages.
Raj et al., "Effect of Annealing Time in the Low-Temperature Growth of BFO Thin Films Spin Coated on Glass Substrates," Journal of Materials Science: materials in Electronics, Oct. 2013, 10 pages, DOI: 10.1007/s10854-013-1374-0.

Restriction Requirement notified Apr. 15, 2022 for U.S. Appl. No. 17/315,111.
Restriction Requirement notified Apr. 15, 2022 for U.S. Appl. No. 17/315,139.
Restriction Requirement notified Aug. 5, 2022 for U.S. Appl. No. 17/359,325.
Restriction Requirement notified Aug. 26, 2022 for U.S. Appl. No. 17/390,796.
Restriction Requirement notified Mar. 23, 2022 for U.S. Appl. No. 17/315,143.
Robertson et al., "High-K Materials and metal Gates for CMOS Applications," Materials Science and Engineering: R: Reports, vol. 88, Feb. 2015, pp. 1-41.
Run-Lan et al., "Study on Ferroelectric Behaviors and Ferroelectric Nanodomains of YMno3 Thin Film", Acta Phys. Sin. vol. 63, No. 18 (2014). Supported by the National Natural Science Foundation of China. DOI: 10.7498/aps.187701. 6 pages.
Ryckaert et al., "Extending the Roadmap Beyond 3nm Through System Scaling Boosters: A Case Study on Buried Power Rail and Backside Power Delivery," 2019 Electron Devices Technology and Manufacturing Conferences (EDTM), IEEE. pp. 50-52 (3 pages).
Salahuddin et al., "Buried Power SRAM DTCO and System-Level Benchmarking in N3," 2020 Symposium on VLSI Technology Digest of Technical Papers—JFS3.3 IEEE. 2 pages.
Salahuddin et al., "SRAM with Buried Power Distribution to Improve Write Margin and Performance in Advanced Technology Nodes," IEEE Electron Device Letters, vol. 40, Issue: 8, Aug. 2019. 4 pages. DOI: 10.1109/LED.2019.2921209.
Seager et al., "Charge Trapping and Device Behavior in Ferroelectric Memories," Appl. Phys. Lett. 68(2660); https://doi.org/10.1063/1.116273; published Jun. 4, 1998 (4 pages).
Second Office Action notified Jul. 26, 2022 for Taiwan Patent Application No. 110129115.
Si et al., "Ultrafast Measurements of Polarization Switching Dynamics on Ferroelectric and Anti-Ferroelectric Hafnium Zirconium Oxide," Appl. Phys. Lett. 115, 072107 (2019); https://doi.org/10.1063/1.5098786. Published Aug. 14, 2019, (6 pages).
Tanaka, S. et al., "FRAM cell design with high immunity to fatigue and imprint for 0.5 /spl mu/m 3 V 1T1C 1 Mbit FRAM", in IEEE Transactions on Electron Devices, vol. 47, No. 4, pp. 781-788, Apr. 2000.
Wang et al., "On the Importance of the Work Function and Electron Carrier Density of Oxide Electrodes for the Functional Properties of Ferroelectric Capacitors," Phys. Status Solidi RRL 2020, 14, 1900520; DOI: 10.1002/pssr.201900520; (9 pages).
Wang et al., "The Microstructure, Electric, Optical and Photovoltaic Properties of BiFeO3 Thin Films Prepared by Low Temperature Sol-Gel Method," Materials (Basel). May 3, 2019;12(9):1444. 10 pages. doi: 10.3390/ma12091444.
Wu et al., "Enhancement of Ferroelectricity in 5 nm Metal-Ferroelectric-Insulator Technologies by Using a Strained TiN Electrode," Nanomaterials 2022, 12, 468. https://doi.org/10.3390/nano12030468; (8 pages).
Yamaoka, K. et al., "A 0.9-V 1T1C SBT-based embedded nonvolatile FeRAM with a reference voltage scheme and multilayer shielded bit-line structure", in IEEE Journal of Solid-State Circuits, vol. 40, No. 1, pp. 286-292, Jan. 2005.
Yeh et al. "Fabrication and Investigation of Three-Dimensional Ferroelectric Capacitors for the Application of FeRAM," AIP Advances 6, 035128 (2016); https://doi.org/10.1063/1.4945405, Published Online: Mar. 30, 2016, 13 pages.
Yu et al., "Atomic layer deposited ultrathin metal nitride barrier layers for ruthenium interconnect applications" Journal of Vacuum Science & Technology A 35, 03E109 (2017); https://doi.org/10.1116/1.4979709.
Zhao et al., "Improved Ferroelectric Properties in $Hf_{0.5}Zr_{0.5}O_2$ Thin Films by Microwave Annealing," Thin Films by Microwave Annealing. Nanomaterials 2022, 12, 3001. https://doi.org/10.3390/nano12173001; (8 pages).
International Search Report & Written Opinion notified Feb. 6, 2024 for PCT Patent Application No. PCT/US2023/077120.
Office Action (Search Report and Examiner's Written Opinion) notified Dec. 22, 2024 for BE Patent Application No. 2023/00072.

(56) References Cited

OTHER PUBLICATIONS

Office Action (Search Report and Examiner's Written Opinion) notified Dec. 22, 2024 for BE Patent Application No. 2023/00071.
Search Report & Written Opinion notified Jun. 27, 2023 for Belgian Patent Application No. 2022/0072.

* cited by examiner

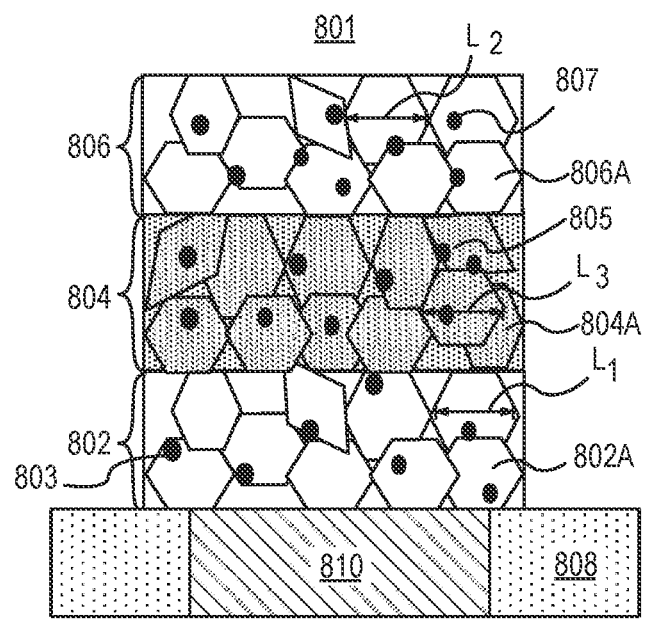
FIG. 8A
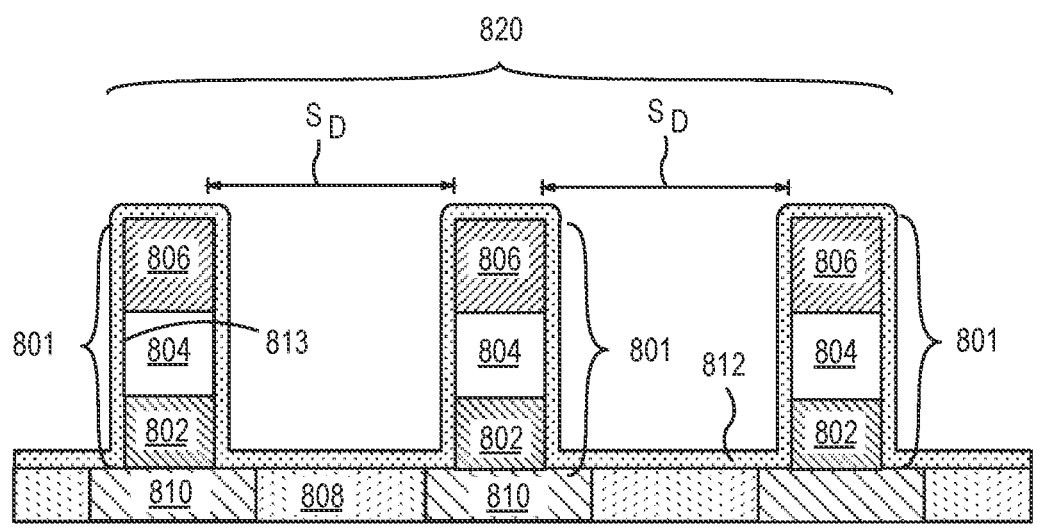
FIG. 8B
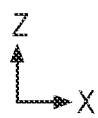

ITERATIVE METHOD OF MULTILAYER STACK DEVELOPMENT FOR DEVICE APPLICATIONS

BACKGROUND

Fabrication of multilayer stack including a ferroelectric material for memory applications is challenging.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 8A is a cross-sectional illustration of a memory device obtained by patterning the multi-layer stack obtained in FIG. 7.

FIG. 8B is a cross-sectional illustration of a plurality of memory devices, where individual memory devices are at least laterally surrounded by an encapsulation layer.

DETAILED DESCRIPTION

Figure 1:
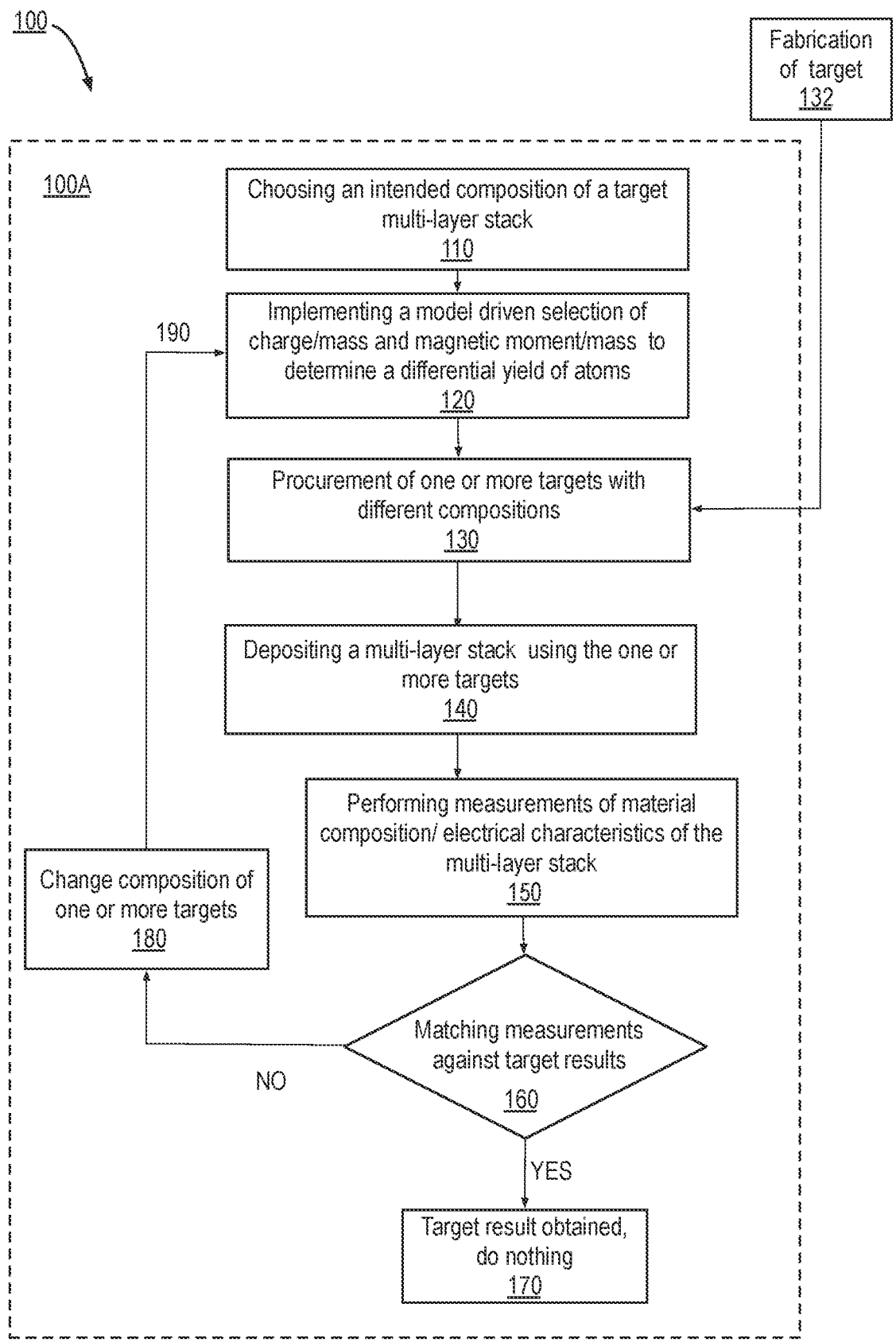
FIG. 1 is a flow diagram of a method of iteratively developing a multilayer stack for application to memory devices, in accordance with an embodiment of the present disclosure.

At least one embodiment describes an iterative method of multi-layer stack development for device applications. While various embodiments are described with reference to ferroelectric random-access memory (FeRAM) or paraelectric random-access memory (RAM), capacitive structures formed herein can be used for any application where a capacitor is desired. For example, the capacitive structure can be used for fabricating ferroelectric based or paraelectric based majority gate, minority gate, and/or threshold gate. In the following description, numerous specific details are set forth, such as structural schemes and detailed fabrication methods to provide a thorough understanding of embodiments of the present disclosure. It will be apparent to one skilled in the art that embodiments of the present disclosure may be practiced without these specific details. In other instances, well-known features, such as process equipment and device operations, are described in lesser detail to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses all possible combinations of one or more of the associated listed items.

The terms "coupled" and "connected," along with their derivatives, may be used herein to describe functional or structural relationships between components. These terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical or in magnetic contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to current signal, voltage signal, magnetic signal, or data/clock signal.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures, or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. Similar distinctions are to be made in the context of component assemblies.

The term "between" may be employed in the context of the z-axis, x-axis or y-axis of a device. A material that is between two other materials may be in contact with one or both of those materials. In another example, a material that is between two or other material may be separated from both of the other two materials by one or more intervening materials. A material "between" two other materials may therefore be in contact with either of the other two materials. In another example, a material "between" two other materials may be coupled to the other two materials through an intervening material. A device that is between two other devices may be directly connected to one or both of those devices. In another example, a device that is between two other devices may be separated from both of the other two devices by one or more intervening devices.

Capacitors with a wide variety of materials are implemented for memory applications such as RAM applications. Nonlinear polar materials offer a wide array of technologically important properties, including ferroelectricity, piezoelectricity, metal-like electrical conductivity, semiconduction, pyroelectricity, etc. Perovskites are an example of non-linear polar material (i.e., materials with the chemical formula $ABO_3$). Perovskite materials are implemented in capacitors for high density FeRAM applications owing to their low power consumption and high on/off ratio. Perovskite FeRAM devices (herein FeRAM devices) may be desirable over other forms of memory, such as magnetic tunnel junction (MTJ) memory device for fabrication advantages. The MTJ can include a stack of 10 or more layers. In contrast, a perovskite based FeRAM device may include three layers for functionality. The ferroelectric dielectric is typically contained between two electrode layers independent of device geometry. The electrode layers may also include perovskite materials to enable lattice matching and reduction in electrical resistance. Introduction of lead-free perovskite materials offer additional environmental benefits without sacrificing device performance.

However, integration of nonlinear polar materials into silicon semiconductor chip fabrication processes can be challenging. From fabrication of a multi-layer stack to patterning devices, and integrating one or more devices with one or more transistors, iterations in experimentation can be technically challenging and extremely time consuming.

Challenges in iterations in experimentation for thin film development begins with material selection and engineering. Film with thickness of less than 100 nm may be considered to be sufficiently thin. While individual layers can be deposited in controlled amounts and stoichiometry of films can be tuned with careful experimentation, deposition of multiple layers in a multi-layer stack is even more challenging. Depositing an individual layer in a multi-layer stack involves forming with correct stoichiometry, crystallinity, crystal structure templating, thickness, and surface roughness to facilitate device functionality. Depositing layers in a multi-layer stack is expected to have the same requisite chemical and electrical properties as single layers, but also be compatible with each other to fabricate a functional memory device. Lattice matching between layers, preserving surface roughness of layers so as to not amplify effects of roughness on upper layers, and avoiding interdiffusion of elements while depositing are some challenges. Conductive layers to be implemented as electrodes are expected to have the correct work function and the dielectric layer is expected to have appropriate polarization and polarization charge density (above 0.1 micro coulomb/$cm^2$). Additionally the multi-layer stack is expected to provide operational capability at adequately low operational voltage (such as below 2V) and devices formed from the multi-layer stack are expected to have an endurance of at least e15 for commercial viability.

In at least one embodiment, obtaining a multi-layer stack with requisite layer properties begins with targeting the deposition process for individual layers. Depending on the embodiments, the deposition process can be physical vapor deposition (PVD) or atomic layer deposition (ALD) based. PVD deposition uses adequate targets for sputter deposition and atomic layer deposition uses appropriate pre-cursors for nucleation. For PVD deposition, targets can be elemental alloys or compounds. In at least one embodiment, modeling of correct charge/mass or magnetic moment to mass for elements in the target and other variables and estimating the correct deposition conditions (e.g., power, pressure, temperature, etc.) is used to form layers with appropriate stoichiometry. Such modeling can enable substantially accurate prediction of sputter yield, a useful parameter in PVD deposition. The iterative nature of experimentation is sequentially and carefully based on results from one or more previous experiments.

When a multi-layer stack is patterned to form a device, the chemical and mechanical properties can be altered during the fabrication process. Air breaks can introduce additional oxygen and/or hydrogen (among other contaminants) leading to chemical reactions at interfaces and formation of undesirable residual layers. Such residual layers may cause increased circuit resistance. Furthermore, interdiffusion of elements in the residual layers can adversely impact parameters such as remnant polarization. Performing thermal anneal can mitigate potential grain size and defect issues as well as device patterning related issues. Thermal anneal can provide hydrogen terminations of dangling bonds. However, implementation of thermal anneal post stack deposition/and or post device fabrication may use careful consideration of thermal budget.

In at least one embodiment, integrating one or more devices with transistors involves experimentations to engineer multi-layer stack to address asymmetry in 1T-1C (one transistor, one capacitor) bit-cell operational voltage characteristics. Other aspects of experimentation involves addressing integration issues associated with fabricating a memory device on a same substrate as a transistor, but post transistor fabrication. Yet other experimentation involves determining appropriate device layout and density requirements to form a useful memory chip. Size of memory devices and transistors may be matched for optimal integrated memory performance. A high operational capacitor voltage may necessitate a transistor that can provide a high current or operate at sufficiently high voltages. Furthermore, where the sequence of fabrication involves fabricating a transistor prior to multi-layer stack deposition, thermal budget for performing an anneal can be an important factor for material selection. Thus, experimentation around a total thermal flux is used for integrated 1T-1C device fabrication.

FIG. 1 is a flow diagram of method 100 of iteratively developing a multilayer stack for application to memory devices, in accordance with an embodiment of the present disclosure. In at least one embodiment, method 100 begins at operation 110 with determining a target multi-layer stack, where the initial material layer stack comprises an initial ferroelectric material of a form AA'BB'O$_3$. In at least one embodiment, the initial material layer stack comprises an initial ferroelectric material of a form AA'BB'O$_3$N$_x$F$_y$. In at least one embodiment, method 100 continues at operation 120 by implementing a model driven target selection based on charge:mass ratio and a magnetic moment:mass ratio, and other variables, that enable accurate prediction of sputter yield. In at least one embodiment, method 100 continues at operation 130 by procuring an initial one or more targets, wherein individual targets in the initial one or more targets comprise single elements or a combination of elements with a respective initial stoichiometric composition. In at least one embodiment, the method to procure targets uses communication with external parts suppliers to request targets that include alloys with certain stoichiometric properties as referenced by operation 130. Such targets can use fabrication lead time from third parties if they are not readily available.

In at least one embodiment, method 100 continues at operation 140 by depositing a multi-layer stack using an initial one or more targets to form the initial multi-layer stack. In at least one embodiment, method 100 continues at operation 150 by performing measurements of chemical composition and electrical properties of the initial multi-layer stack. In at least one embodiment, method 100 continues at operation 160 by matching measurements of chemical composition and electrical properties of the initial multi-layer stack against target results and determining whether the measurements are within a tolerance level of the target results. In at least one embodiment, method 100 may end at operation 170 if measurements are within a tolerance level (e.g., within 5%) of the target results. In at least one embodiment, the method continues at operation 180 by making modifications in response to determining that the measurements are not within the tolerance level. In at least one embodiment, modifications include changing composition of one or more layers in the initial multi-layer stack to form a successive multi-layer stack by implementing a model driven selection, modifying the single elements or the combination of elements in a successive one or more targets to comprise a respective second stoichiometric composition, and procuring the successive one or more targets. In at least one embodiment, method 100 iterates (denoted by arrow 190) by implementing a model driven selection, modifying stoichiometric composition of the one or more targets in the successive one or more targets, procuring the successive one or more targets, and depositing successive multi-layer stacks, performing compositional and electrical measurements, matching measurements with target values, and determining whether measurement results are within the tolerance level of target values, until target results are obtained.

While FIG. 1 is an iterative methodology to fabricate a multi-layer stack, in at least one embodiment, one or more operations (such as operations 110-180) can be further broken down in to sub operations as will be discussed below.

In at least one embodiment, beginning with operation 110, choosing an intended composition of a target multilayer stack includes material selection for least a pair of electrodes for a capacitor and a dielectric material that includes ferroelectric, paraelectric or anti-ferroelectric properties.

In at least one embodiment, dashed box 100A defines operations that are conducted by a first entity and fabrication of target at operation 132 may be carried out by a second entity such as external suppliers, where the second entity is different from the first entity.

Figure 2A:
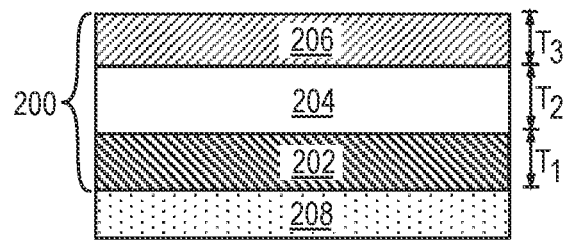
FIG. 2A is a representative tri-layer stack, in accordance with an embodiment of the present disclosure.

FIG. 2A is representative stack 200, in accordance with an embodiment of the present disclosure. In at least one embodiment, stack 200 includes conductive layer 202, dielectric 204 that includes a polar material and conductive layer 206 on dielectric 204. Conductive layer 202 is on substrate 208. In at least one embodiment, substrate 208 includes silicon, silicon-germanium, or germanium.

In at least one embodiment, conductive layer 202 is deposited on substrate 208. In at least one embodiment, conductive layer 202 and conductive layer 206 include a conductive oxide. In at least one embodiment, the conductive oxide includes one of non-Pb perovskite metal oxides, such as but not limited to (La,Sr)FeO$_3$, (La,Sr)CoO$_3$, (La,Ca)MnO$_3$, (La,Sr)MnO$_3$, SrRuO$_3$, Sr$_2$RuO$_4$, (Ba,Sr)RuO$_3$, SrMoO$_3$, (La,Sr)MnO$_3$, SrCoO$_3$, SrCrO$_3$, SrFeO$_3$, SrVO$_3$, CaMoO$_3$, SrNbO$_3$, LaNiO$_3$, YBa$_2$Cu$_3$O$_7$, Bi$_2$Sr$_2$CaCuO$_8$, $CaRuO_3$, $Ir_2O_x$, Ru, $RuO_x$, Mo, $MoO_x$, or $WO_x$. In other embodiments, conductive layer 202 and conductive layer 206 include a metal such as but not limited to Ir, Ru or W.

In at least one embodiment, dielectric 204 comprises a polar layer comprising a base polar material substitutionally doped with a dopant. In least one embodiment, dielectric 204 comprises a crystalline polar layer. In at least one embodiment, the base polar material can include one or more metal elements and one or both of oxygen and nitrogen. In at least one embodiment, the dopant can include a metal element of one of 4d series, 5d series, 6d series, 4f series or 5f series.

In at least one embodiment, dielectric 204 is a ferroelectric dielectric layer that includes non-Pb based perovskite material in the form $ABO_3$, where A and B are two cations of different sizes and O is Oxygen. In at least one embodiment, A is generally larger than B in size. In at least one embodiment, non-Pb perovskites can also be doped, e.g., by La or Lanthanides. In at least one embodiment, the non-Pb perovskite material can include one or more of: La, Sr, Co, Cr, K, Nb, Na, Sr, Ru, Y, Fe, Ba, Hf, Zr, Cu, Ta, Bi, Ca, Ti, or Ni. In at least one embodiment, dielectric 204 includes bismuth ferrite (BFO) with a doping material, wherein the doping material is one of lanthanum, elements from the lanthanide series of the periodic table, or elements of the 3d, 4d, 5d, 4f, or 5f series of the periodic table.

In at least one embodiment, dielectric 204 includes low voltage ferroelectric (FE) material sandwiched between conductive layer 206 and conductive layer 202. In at least one embodiment, these low voltage FE materials can be of the form $AA'BB'O_3$, where A' is a dopant for atomic site A and can be an element from the Lanthanides series, where B' is a dopant for atomic site B and can be an element from the transition metal elements such as Sc, Ti, V, Cr, Mn, Fe, Co, Ni, Cu, or Zn. A' may have the same valency of site A, with a different ferroelectric polarizability. In at least one embodiment, voltage below 2-Volts is sufficiently low to be characterized as low voltage. In at least one embodiment, dielectric 204 is of the form $AA'BB'O_3$.

In at least one embodiment, dielectric 204 includes a paraelectric material, the paraelectric material comprises $SrTiO_3$, $Ba_{(x)}Sr_{(y)}TiO_3$, $HfZrO_2$, Hf—Si—O, La-substituted $PbTiO_3$, or a PMN-PT based relaxor ferroelectrics. In at least one embodiment, x is −0.05, and y is 0.95 for $Ba_{(x)}Sr_{(y)}TiO_3$.

In at least one embodiment, dielectric 204 includes an anti-ferroelectric material. In at least one embodiment, the antiferroelectric material may include one of: PZT with >30% Zr doping or Sn doping >25%, La-doped PZT with >30% Zr doping and/or Sn doping >20%, HfSiO2 and HfZrOx with >30% Si and >30% Zr doping, ZrO2, $NaNbO_3$, or >5% K doped $NaNbO_3$. In at least one embodiment, the choice of materials depends on a variety of factors. In at least one embodiment, factors include electrical results, fabrication of devices, and integrability with a transistor.

In at least one embodiment, conductive layer 202 may be deposited to a thickness $T_1$ between 3 nm and 30 nm (inclusive). In at least one embodiment, conductive layer 206 may be deposited to a thickness $T_3$ between 3 nm and 30 nm (inclusive). In at least one embodiment, dielectric 204 may be deposited to thickness $T_2$ between 1 nm and 30 nm (inclusive).

Figure 2B:
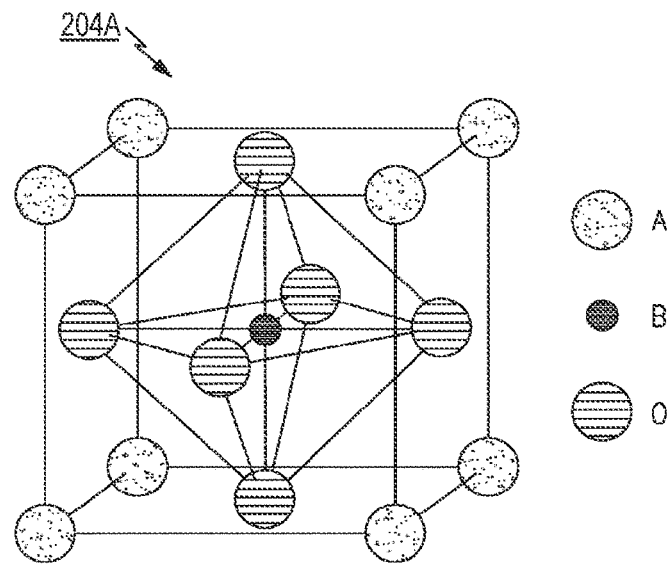
FIG. 2B schematically illustrates a perovskite crystal structure of a polar layer of the material layer stack in FIG. 2A, in accordance with an embodiment of the present disclosure.

FIG. 2B schematically illustrates a perovskite crystal structure of a polar layer of the material layer stack in FIG. 2A, in accordance with an embodiment of the present disclosure. In at least one embodiment, the crystalline polar layer has a perovskite structure 204A. In at least one embodiment, perovskite structure 204A represents a crystalline oxide in a paraelectric state, which may have a chemical formula $ABO_3$, where each of A and B represent one or more metal cations and O represents an oxygen anion. In at least one embodiment, the crystalline polar layer can have more than one element represented by A (e.g., A1, A2, ... AN) and/or more than one element represented by B (e.g., B1, B2, ... BN), and can be doped with one or more dopants represented by A' (e.g., A'1, A'2, ... A'N) and/or one or more dopants represented by B' (e.g., B'1, B'2, ... B'N), as described above. Here, A-site cations occupy the corners, while B-site cations sit in the body center of the perovskite structure 204A. In at least one embodiment, three oxygen atoms per unit cell rest on the faces of the perovskite structure 204A. In at least one embodiment, various perovskite structures have, without limitation, a lattice constant close to approximately 4 Angstroms due to the rigidity of the oxygen octahedra network and the well-defined oxygen ionic radius of 1.35 Angstroms. In at least one embodiment, many different cations can be substituted on both the A and B sites as dopants to achieve the various advantageous properties described herein while maintaining the overall crystal structure. According to various embodiments, a dopant atom can occupy A or B sites to form substitutionally doped solid solutions. In at least one embodiment, a dopant occupying the A sites can have a very different effect on the base polar material than a dopant occupying the B sites.

In at least one embodiment, for a polar layer comprising barium titanate ($BaTiO_3$), which may be a paraelectric material having a cubic perovskite structure, the A sites are occupied by Ba atoms while Ti atoms occupy the B sites and are surrounded by octahedra of O atoms, and the O atoms are located at the center of each face of the unit cell. In at least one embodiment, for $BaTiO_3$, in the paraelectric phase, perovskite structure 204A may be cubic or tetragonal above the Curie temperature (which may be about 130 degrees Celsius). In at least one embodiment, in the paraelectric phase, the O atoms may occupy a mid-position with respect to each pair of O atoms on opposing faces of the unit cell. In at least one embodiment, below the Curie temperature, in the ferroelectric phase, the perovskite structure 204A may have a tetragonal structure in which the B sub lattice (e.g., Ti sub lattice in $BaTiO_3$) and O atoms may shift in opposite direction with respect to the Ba atoms, taken as reference. In at least one embodiment, these atomic shifts may be accompanied by a small relaxation of the unit cell that becomes tetragonal (when the paraelectric phase is cubic) or further elongated tetragonal (when the paraelectric phase is tetragonal) and produce a stable polarization (e.g., about 26 $\mu C/cm^2$). In at least one embodiment, in the tetragonal phase, the cubic symmetry is broken, resulting in six symmetry equivalent variants with polarization along the [100], [010], and [001] directions.

Figure 3A:
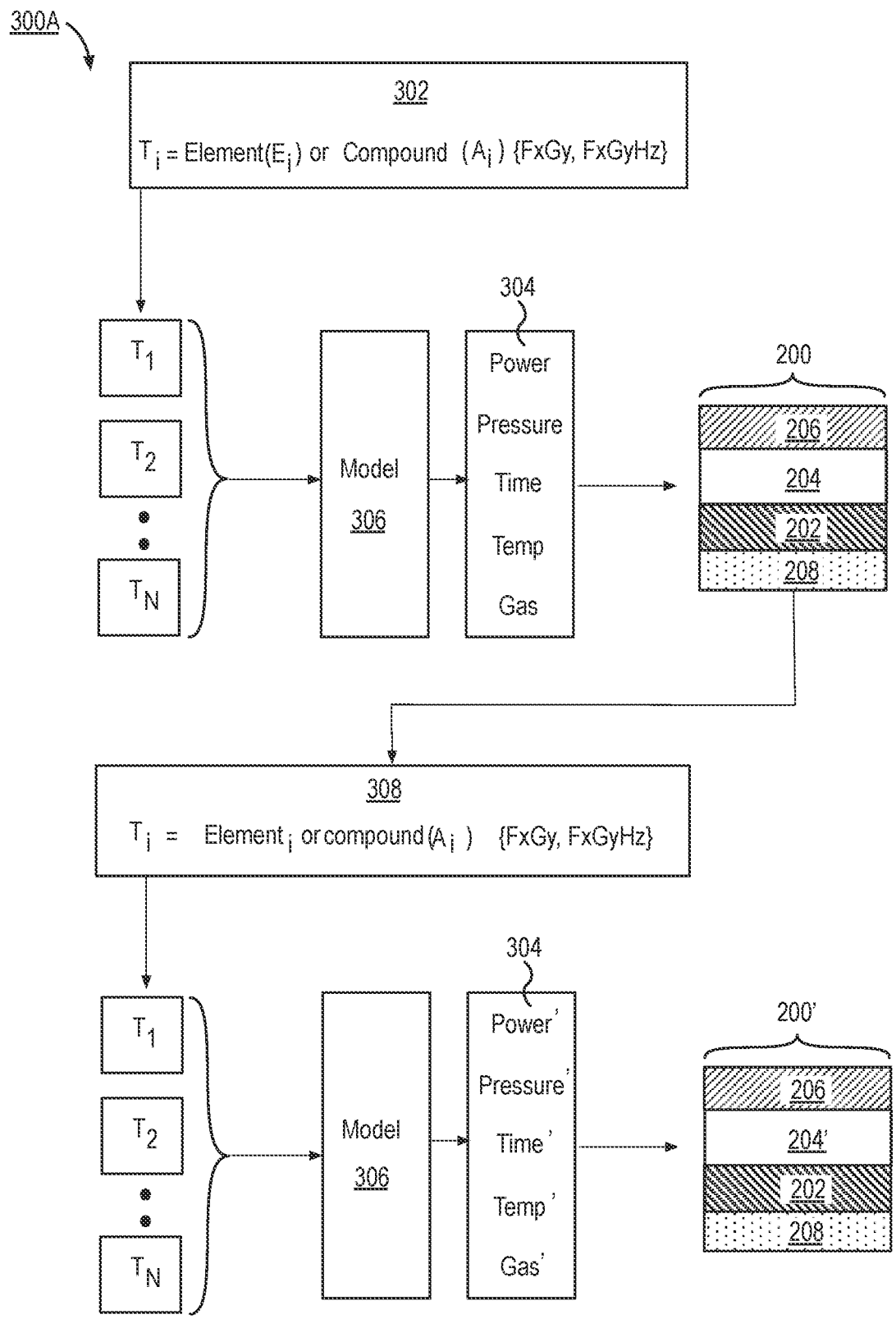
FIG. 3A is a flow diagram of a method illustrating iterations in a multilayer stack deposition as performed utilizing one or more targets in a tool, in accordance with an embodiment of the present disclosure.

FIG. 3A is a flow diagram of method 300A illustrating iterations in a multilayer stack deposition as performed utilizing one or more targets 302 in deposition tool 304, in accordance with an embodiment of the present disclosure. In at least one embodiment, deposition tool 304 is a physical vapor deposition tool. In at least one embodiment, one or more targets 302 includes individual targets $T_i$. In at least one embodiment, $T_i$ includes an element $E_i$ or an alloy$_i$, where subscript "i" corresponds to the number of targets 302, such as for example 1, 2, 3, 4, etc. In at least one embodiment, the number of individual targets $T_i$ depends on a material that is to be deposited, i.e., N refers to a last target. In at least one embodiment, the number of individual targets $T_i$ can depend on the number of elements present in the material deposited. In at least one embodiment, where individual targets $T_i$ are alloys or compounds ($A_i$), $A_i$ can be binary alloys or compounds of the form $F_xG_y$, or ternary alloys or compounds of the form $F_xG_yH_z$, where F and G can be metals and H can be a non-metal like O.

In at least one embodiment, for a polar material such as $BiFeO_3$, the number of elements is 3. In at least one embodiment, Bi and Fe can be available as >99% pure elemental sputtering targets. In at least one embodiment, oxygen may be inserted into the sputtering environment as a gas or be part of a compound with iron in a binary compound. In at least one embodiment, for sputtering $BiFeO_3$ the total number of targets can be 1 or 2 (i.e., N can range from 1 to 2).

In at least one embodiment, for a polar material such as $BiFeO_3$, the number of elements is 3. In at least one embodiment, while Bi and Fe can be available as >99% pure elemental sputtering targets. In at least one embodiment, oxygen may be inserted into the sputtering environment as a gas or be part of a compound with iron in a binary compound. In at least one embodiment, for sputtering $BiFeO_3$ the total number of targets can be 1 or 2 (i.e., N can range from 1 to 2).

In at least one embodiment, sputtering targets including multi-elemental compounds can be fabricated by arc-melting or radio-frequency melting of a mixture of metals in a vacuum or gas atmosphere. In at least one embodiment, the gas can be inert or include O, N, H, or F. In at least one embodiment sputtering targets including multi-elemental compounds can be fabricated by mixing the constituent binary oxides in the stoichiometric ratio, followed by Hot Isostatic Pressing (HIP). In at least one embodiment sputtering targets including multi-elemental compounds can be fabricated by mixing the constituent binary oxides in the stoichiometric ratio, followed by cold pressing the powder mixture into a ceramic compact using a pneumatic press, followed by sintering of the ceramic compact at high temperatures to obtain the desired chemistry and density of the target.

In at least one embodiment, the density of target is between 85 and 95% of theoretical material density.

In at least one embodiment, model 306 that utilizes information about charge/mass ratio and magnetic moment/mass ratio of ions (elemental or ionized alloys) can be implemented to estimate sputtering coefficients and rates within a PVD tool. In at least one embodiment, charge/mass ratio and magnetic moment/mass ratio are used in enabling an accurate prediction of sputter yield, deposition rates and composition of a deposited layer in deposition systems that utilize magnetic fields. In at least one embodiment, the computational model further utilizes operational parameters of tool 304 to calculate deposition rates on a substrate. In at least one embodiment, operational parameters may include radio frequency (RF) magnetron deposition power, chamber operational pressure, sputtering time, temperature of chamber, and/or substrate, and types and concentration of gases flowing during deposition. In at least one embodiment, the gas utilized for deposition can be inert, such as Ar, and/or include other gases such as such as $O_2$, $N_2$, $H_2$, Kr, and Ne.

In at least one embodiment, the deposition process to form stack 200 may include deposition of all layers without an air break. In at least one embodiment, air break may be avoided to prevent interfacial layers from forming between electrode layers and the dielectric layer. In at least one embodiment, interfacial layers can provide an additional source of oxygen during cycling of devices fabricated from stack 200. In at least one embodiment, additional sources of oxygen may not be controllable and may lead to instability or loss of endurance during device cycling. In at least one embodiment, for a certain combination of targets $A_i$, the deposition process may yield dielectric 204 in stack 200. In at least one embodiment, stack 200 has properties of stack 200 described in association with FIG. 2A. In at least one embodiment, properties of stack 200 may be determined by a series of measurement methods outlined in Table 1. In at least one embodiment, dielectric 204 may not have the desired properties of a target dielectric layer, such as correct stoichiometry, thickness, uniformity, etc.

In at least one embodiment, same targets 302 may be utilized to deposit a new stack 200'. In at least one embodiment, tool deposition conditions can be changed based on inputs to model 306. In at least one embodiment, a new set of operational parameters power', chamber operational pressure', sputtering time', temperature', and gases' may be implemented to achieve stack 200'. In at least one such embodiment, stack 200', comprising a dielectric 204', may have the desired properties of a target dielectric layer, such as correct stoichiometry, thickness, uniformity, etc.

In at least one embodiment, the process to alter PVD tool parameters can be iteratively changed based on inputs from measurements and model 306 until stack 200' achieves target values that are within tolerance of results that are desired. In at least one embodiment, power' can range between 5 Watts per square inch and 75 Watts per square inch, chamber operational pressure' can range between 0.5 milli Torr and 30 milli Torr, and temperature' of chamber and or substrate can range between room temperature to 650 degrees Celsius.

Figure 3B:
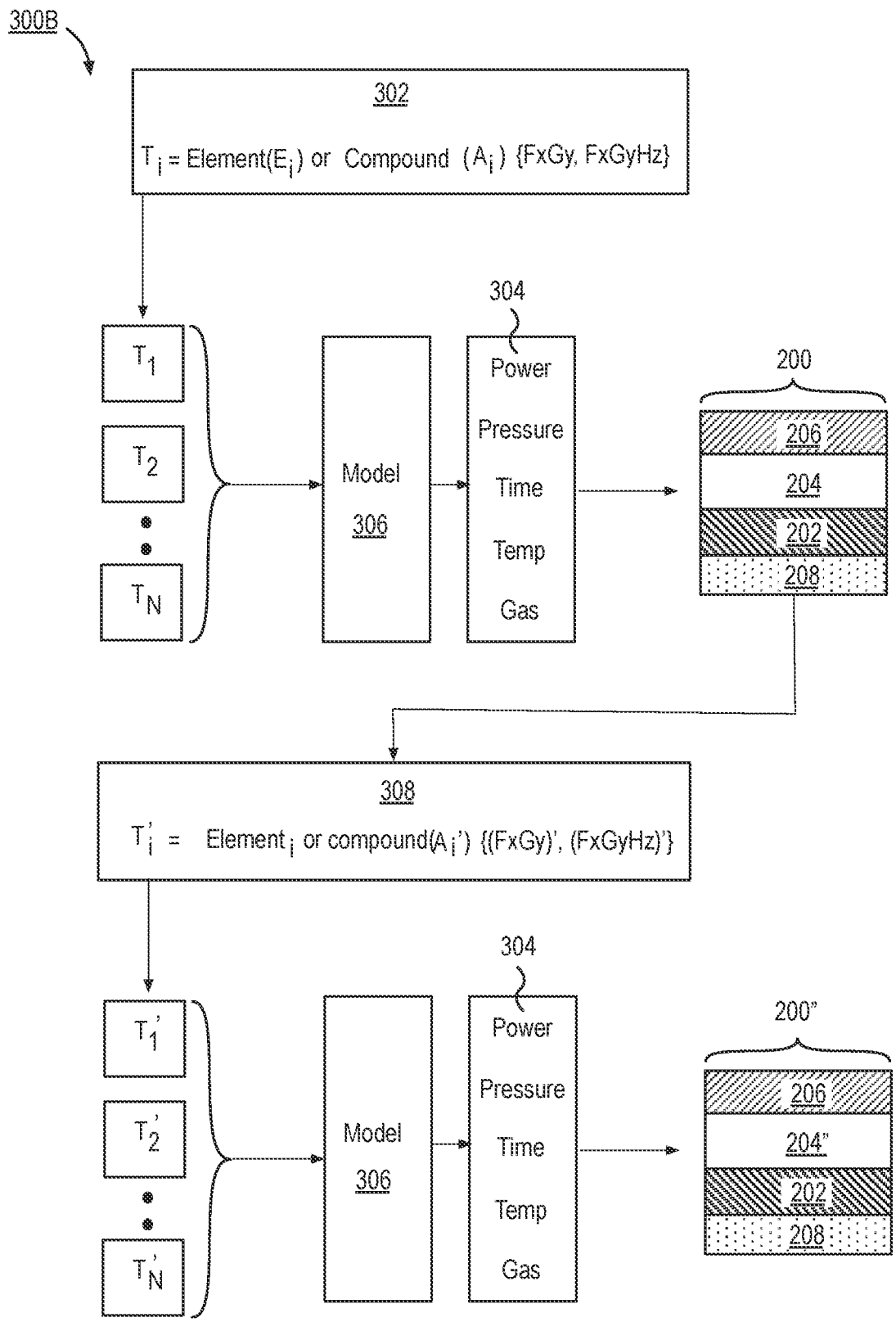
FIG. 3B is a flow diagram of a method illustrating iterations in a multilayer stack deposition as performed utilizing one or more targets in a tool, in accordance with an embodiment of the present disclosure.

In at least one embodiment, it may be deduced that, because of the methodology in FIG. 3A, target results can be substantially within reach if one or more individual targets $T_i$ are changed. In at least one embodiment, this method is illustrated in FIG. 3B. In at least one embodiment, after initial experimentation and obtaining stack 200, a new one or more targets 308 may be implemented, in accordance with method 300B.

In at least one embodiment, targets 308 includes one or more individual targets $T_i'$, that include one or more new compounds $A_i'\{(F_xG_y)_i', (F_xG_yH_z)_i'\}$. In at least one embodiment, individual stoichiometry within the compounds including Bi, Fe, and O can be different by 5% from compounds including Bi, Fe, O in the first one or more targets. In at least one embodiment, individual stoichiometry within the compounds including Bi, Fe, and O can be different by 10% from compounds including Bi, Fe, and O in the first one or more targets. In at least one embodiment, elemental targets $E_i$ may have the same purity as before, or the purity can be changed in other embodiments. In at least one embodiment, a new purity can range from 99% to 99.5% in some examples.

In at least one embodiment, model 306 may be implemented on new targets $T_i'$ to compute tool parameters. In at least one embodiment, the tool parameters may be non-different from that utilized to fabricate stack 200. In the illustrative embodiment, one or more properties of dielectric 204 is altered with an iteration in modification in one or more targets. In at least one embodiment, due to differences in targets $T_i'$, dielectric layer 204" in stack 200" may have useful properties, such as stoichiometry, thickness, uniformity, etc. Stack 200' and 200" comprising dielectric 204' and 204", respectively, may have the desired properties of a target dielectric layer that are substantially matched and within tolerance of target results.

In at least one embodiment, while experimentation with emphasis on a $BiFeO_3$ dielectric 204 has been described, methods 300A and 300B may be generalized to apply to the variety of material choices described above for dielectric 204. In at least one embodiment, $BiFeO_3$ may also be doped with other materials, such as a metal element of one of the 3d, 4d, 5d, 6d, 4f, and 5f series of the periodic table.

While experimentation with emphasis on dielectric 204 has been described, method 300A or 300B may be utilized to iteratively fine tune chemical and electrical properties, such as resistivity, work function, crystallinity, etc. of conductive layers 202 and 206. Such properties of conductive layers 202 and 206 may be tuned individually or collectively as part of stack 200, in accordance with at least one embodiment.

Referring to FIGS. 3A and 3B, in at least one embodiment, when an in-situ deposition process is carried out when depositing to form stack 200, 200', or 200", targets $T_i$ or $T_i'$ can include materials utilized in depositing all the layers in stack 200, 200', or 200". In at least one embodiment, minimizing iterations is useful to accelerate development and lower costs.

In at least one embodiment, evaluation of chemical, mechanical, and electrical properties of stack 200, 200', and 200" can be made by a plethora of measurement techniques. In at least one embodiment, it is useful to perform a ferroelectric hysteresis measurement (P-E loop) to analyze how effective a particular ferroelectric dielectric layer is. In at least one embodiment, a simple measurement technique involves applying an electric field applied across a sample. In at least one embodiment, the field is attenuated by a resistor divider. In at least one embodiment, a measured current through the circuit is integrated into charge by a capacitor that is positioned in series with the sample. In at least one embodiment, the applied voltage and measured voltage drop (current measurement) signals are utilized to generate a polarization versus electric field loop by an oscilloscope.

Figure 4:
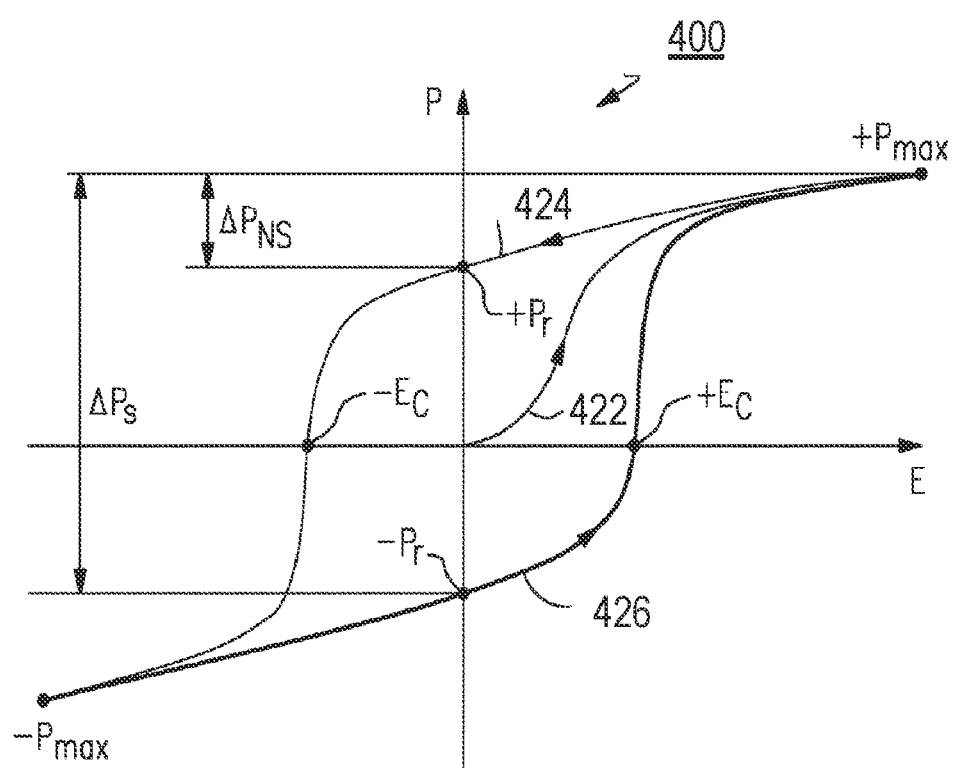
FIG. 4 is a polarization vs. electric field plot for a representative multi-layer stack including a ferroelectric material.

FIG. 4 schematically illustrates a polarization field (P-E) loop 400 of multi-layer stack that includes a ferroelectric material, such as stack 200, illustrated with respect to FIG. 2A. In at least one embodiment, dielectric 204 comprises a storage layer, e.g., a ferroelectric layer. Referring again to FIG. 4, in at least one embodiment, P-E loop 400 may represent that of the ferroelectric layer comprising a polydomain ferroelectric material. In at least one embodiment, prior to polarization for the first time, there may initially be a statistical distribution of ferroelectric domains such that the net polarization at zero field is about zero. In at least one embodiment, the initial polarization (P) may be represented by a P-E curve portion 422. In at least one embodiment, when the ferroelectric layer is polarized for the first time by applying a positive electric field, starting with a polarization P=0, the polarization increases with increasing electric field until it reaches saturation at +Pmax. In at least one embodiment, after the saturation is reached at +Pmax, when the electric field is subsequently reduced according to P-E curve portion 424, at E=0, a polarization may remain. In at least one embodiment, the remaining polarization is referred to herein as a remnant polarization (+Pr). In at least one embodiment, to bring the polarization back to zero, a negative electric field may be applied. In at least one embodiment, a sufficient electric field for reducing the polarization back to zero is referred to herein as a coercive field (+Ec). In at least one embodiment, according to P-E curve portion 424, a negative coercive field (−Ec) may be applied to reduce the polarization to zero from the +Pr. In at least one embodiment, if the negative voltage or field is further increased in magnitude, then the hysteresis loop may behave similarly to that under a positive but in a reverse sense.

In at least one embodiment, the negative P increases in magnitude with increasing negative electric field until it reaches saturation at −Pmax. In at least one embodiment, when the electric field is subsequently reduced in magnitude along a P-E curve portion 426, at E=0, a remnant polarization $-P_r$ may remain. In at least one embodiment, the ferroelectric layer exhibits a characteristic of a remnant polarization $+P_r$ or $-P_r$ which can be reversed by an applied electric field in the reverse direction. In at least one embodiment, this gives rise to a hysteretic P-E loop in ferroelectric memory devices. In at least one embodiment, by using thin film technologies, operation fields or voltages may be reduced to a level below standard chip data in a non-volatile state and allows data to be rewritten fast and frequently. In at least one embodiment, a ferroelectric memory device has the advantageous features of both volatile and nonvolatile memory technologies. In at least one embodiment, voltage pulses are used to write and read the digital information. In at least one embodiment, if an electric field pulse is applied in the same direction as the remnant polarization, no switching may occur. In at least one embodiment, a change in polarization delta $P_{NS}$ or $\Delta P_{NS}$ between $P_{max}$ and $P_r$ may be present due to the dielectric response of the ferroelectric material. In at least one embodiment, if an electric field pulse is applied in the opposite direction as the remnant polarization, switching may occur. In at least one embodiment, if the initial polarization is in the opposite direction as the applied electric field, the polarization of the ferroelectric layer reverses giving rise to an increased switching polarization change delta $P_s$ or $\Delta P_s$.

In at least one embodiment, P-E loop 400 can be measured in blanket stacks. Other measurements described in Table 1 below, can also be performed during the iterative development method described in association with FIGS. 1 and 3A-3B. In at least one embodiment, measurements described provide mechanical/chemical composition and electrical characteristics of one or more layers of a multilayer stack such as stacks 200, 200' and 200" (FIGS. 1, 3A-3B). Measurement technique and the associated measurement are listed in Table 1, in accordance with at least one embodiment.

TABLE 1

| Measurement Technique | Parameter |
| --- | --- |
| Transmission Electron Microscopy | Crystallinity, structure, morphology (e.g., grain size) |
| X-ray diffraction (Bragg diffraction) | Crystallinity, lattice constants, grain size, concentration gradient, strain |
| Positive Up Negative Down method | Measurement of switchable polarization vs. electric field |
| Atomic Force Microscopy (AFM), and Conductive-AFM (c-AFM) | surface roughness (AFM); current-voltage characteristics (c-AFM) |
| Picoammeter | Current-Voltage, cycling, endurance |
| Piezoelectric force microscopy | Ferroelectricity of switching layer |
| Kelvin probe force microscopy | Electrode work function |

In at least one embodiment, measurement techniques such as transmission electron microscopy may be utilized to obtain high resolution images of layers, interfaces between layers, arrangements of atoms, atomic planes, and dislocations among other things. In at least one embodiment, Xray diffraction may be utilized to measure phase identification of crystalline material in electrodes as well as in a ferroelectric dielectric layer. In at least one embodiment, positive-up and negative-down method may be utilized to measure switchable polarization versus electric field in a multi-layer stack. In at least one embodiment, Atomic Force Microscopy (AFM) may be utilized to measure surface roughness and microstructure of an uppermost layer in a stack. In at least one embodiment, conductive AFM may be utilized to measure current-voltage characteristics of the multi-layer stack. In at least one embodiment, piezoelectric force microscopy may be utilized to measure ferroelectricity of the ferroelectric dielectric layer. In at least one embodiment, Kelvin probe force microscopy may be utilized to measure electrode work function of electrodes in the multi-layer stack.

In at least one embodiment, at least some of the measurements described above may be made after device fabrication. In at least one embodiment, surface roughness, especially of a lower conductive layer, may be measured after depositing a single layer at a time.

Figure 5:
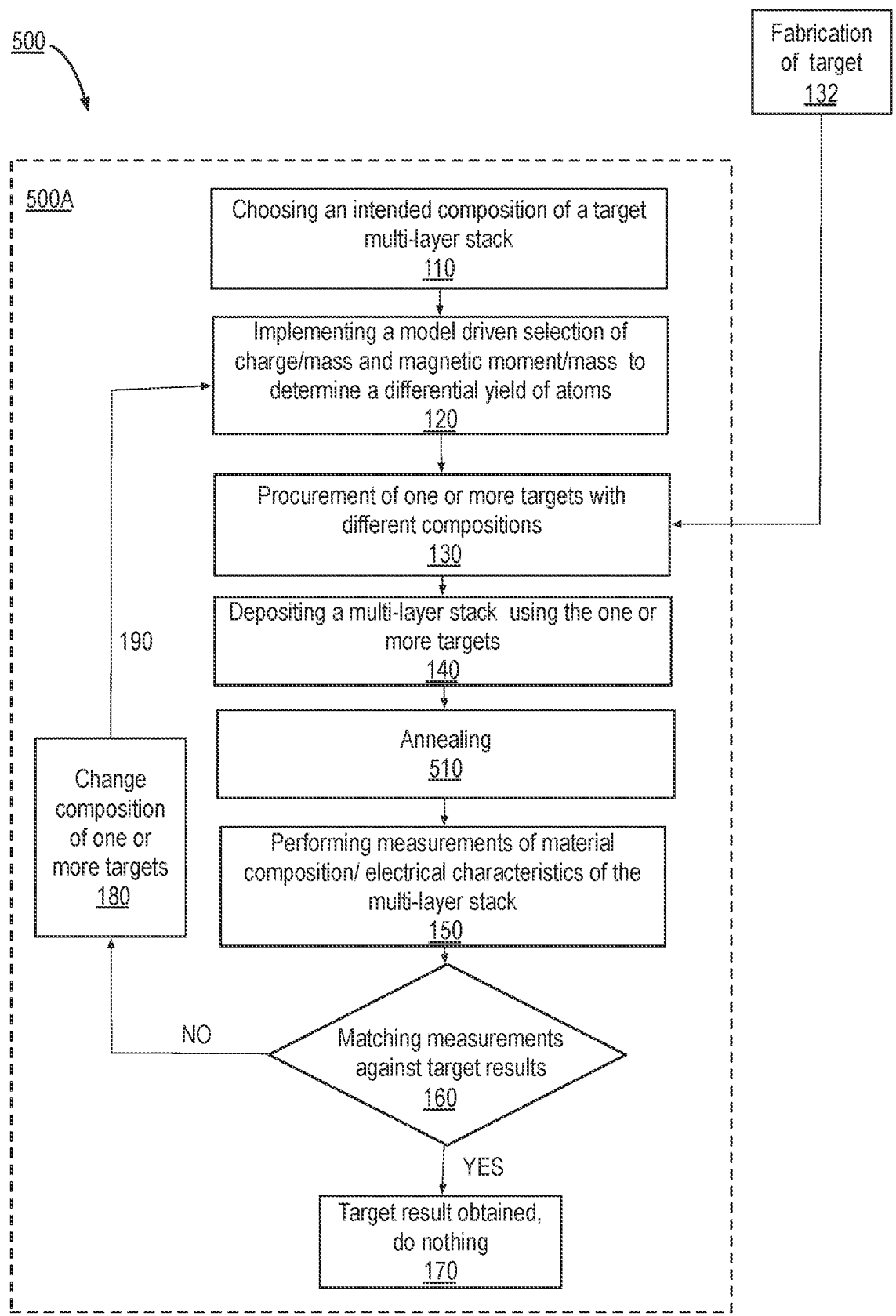
FIG. 5 is a flow diagram of a method of iteratively developing a multilayer stack for application to memory devices, where the method further includes annealing the multilayer stack, in accordance with an embodiment of the present disclosure.

FIG. 5 is a flow diagram of method 500 of iteratively developing a multilayer stack for application to memory devices, in accordance with at least one embodiment of the present disclosure. In at least one embodiment, method 500 includes features of method 100 (FIG. 1) with an addition of an anneal operation 510 between formation of a multi-layer stack at operation 140 and measuring material composition and performing measurements of material composition and electrical test characterization at operation 150.

In at least one embodiment, achieving a grain size that is conducive for increasing effective polarization in the dielectric layer is useful for high performance memory devices. In at least one embodiment, modulation of grain size may be accomplished by performing an anneal process at high temperatures. In at least one embodiment, the anneal process includes rapid thermal treatment processes (herein PD-RTA). In at least one embodiment, PD-RTA may utilize temperatures greater than or equal to 400 degrees Celsius. In at least one embodiment, blanket unpatterned stacks may be heated to high temperatures, such as temperatures above 800 degrees Celsius to determine optimal properties of a particular multi-layer stack. In at least one embodiment, anneal durations may be 10-30 minutes to test limits of the multi-layer stack.

In at least one embodiment, anneal temperatures can be higher than 800 degrees Celsius, the duration of most processes may be limited to approximately 1 minute or less for patterned memory devices, for example, when such memory devices are integrated with a transistor. In at least one embodiment, a process at high temperature but with a short time duration may be compatible with transistors that are embedded within the substrate on which the perovskite material is formed. In at least one embodiment, such a method is particularly advantageous when transistors are fabricated using a gate last process to prevent threshold voltage shifts arising from high temperature operations lasting substantially greater than 1 minute.

In at least one embodiment, a post deposition anneal (PDA) may be characterized by a thermal anneal of a layer or a stack after the deposition process has been performed. In at least one embodiment, this contrasts with an in-situ anneal which takes place during deposition. In at least one embodiment, PDA may be performed after all layers in a multi-layer stack, are deposited. In at least one embodiment, the anneal process can be performed following a patterning process utilized to fabricate memory devices. In at least one embodiment, following the deposition of a first conductive layer and a dielectric layer, the anneal process can be performed prior to deposition of a second conductive layer on the dielectric layer. In at least one embodiment, PDA is performed after deposition of the multi-layer stack. In at least one embodiment, where anneal operation 510 is inserted prior to performing measurements of the multi-layer stack, such measurements may be compared to measurements obtained from an identical unannealed multi-layer stack.

In at least one embodiment, anneal temperatures can be as high as 1300 degrees Celsius, where anneal time durations are limited to less than or equal to 60 seconds. In at least one embodiment, the specific temperature and time duration is dependent on the annealing technique utilized and a maximum thermal budget that is compatible with, a transistor for integrated device applications. In at least one embodiment, for temperatures less than 700 degrees Celsius, a time duration of 60 seconds or less, for example, may be relatively short.

In at least one embodiment, post deposition rapid thermal annealing may be used to describe all thermal annealing treatments where a wafer is heated and cooled at rates faster than is typical in furnace annealing tools. In at least one embodiment, heating/cooling rates can be more than 10 degrees Celsius/second. In at least one embodiment, such rapid heating and cooling can be achieved using a variety of technologies. The terms "RTP" or "RTA" are sometimes defined to describe the original rapid thermal annealing technique, in which infra-red lamps may be implemented to heat the wafer. In at least one embodiment, Xenon-lamp based heating (also called "Flash" annealing), laser heating (Laser annealing), and microwave energy (Microwave annealing) may be used to heat the wafer. In at least one embodiment, surface temperatures of substrate may be monitored by pyrometer and thermocouples. In at least one embodiment, such techniques can offer extremely fast heating and cooling rates, such as 1 million degrees per second. In at least one embodiment, it is useful for the cooling process to be controlled to prevent dislocations in the various layers.

In at least one embodiment, post deposition anneal can include one or more of the above techniques. In at least one embodiment, RTP/RTA can be performed at temperatures above 1000° Celsius. In at least one embodiment, since the duration is on the order of a minimum of a few seconds, RTP/RTA may be used for annealing to temperatures less than 800° Celsius.

In at least one embodiment, PDA includes an RTP process which is carried out in $O_2$, $N_2$, Argon environment or in air. In at least one embodiment, processing pressures range from 1 Torr to 760 Torr while flowing in $O_2$, $N_2$ or Argon gases. In at least one embodiment, RTP process is carried out in vacuum at pressures less than 1 Torr. In at least one embodiment, processing times range from is to 60 s. In at least one embodiment, processing temperatures range from 400 to 700 degrees Celsius, where the heating and cooling rate is approximately 40 to 200 degrees Celsius/second.

In at least one embodiment, PDA includes a flash anneal process. In at least one embodiment, flash and laser annealing offer extremely short durations, and thus can allow high temperatures greater than 1000° Celsius without damaging the underlying structures e.g., transistors on the wafer. In at least one embodiment, flash and laser anneal can include spot heating or beam rastering for increased throughput. In at least one embodiment, processing pressures range from 1 Torr to 760 Torr while flowing in $O_2$, $N_2$, Argon gases, or in air. In at least one embodiment, flash anneal process is carried out in vacuum at pressures less than 1 Torr. In at least one embodiment, processing temperatures range from 500 to 1300 degrees Celsius, where the heating and cooling rate is approximately $10^6$ degrees Celsius/second. In at least one embodiment, processing times are 1 ms or less. In other embodiments the total anneal time can be 10 ms/flash. In at least one embodiment, the total number of flashes can be up to 100 flashes per sample (wafer, substrate etc).

In at least one embodiment, PDA includes a laser anneal process. In at least one embodiment, processing temperatures range from 600 to 1300 degrees Celsius, where the heating and cooling rate is approximately $10^6$ degrees Celsius/second. In embodiments, processing times is 100 microseconds or less. In some such embodiment, the anneal time can be 100 ms/laser anneal process. In at least one embodiment, the total number of laser anneals can be up to 100 per sample (wafer, substrate etc).

In at least one embodiment, the multi-layer stack may be deposited by a PVD process at 350° Celsius, annealed by PD-RTA process in an RTP tool with a 50° Celsius/second heating/cooling rates, in $O_2$ atmosphere at 760 Torr pressure and at 600° Celsius for 60 seconds. In at least one embodiment, the multi-layer stack may be deposited by a PVD process at 350° Celsius, annealed by PD-RTA process in a laser annealing tool with a $10^6$ degrees Celsius/second heating/cooling rates, in vacuum and at 1200° Celsius for 10 microseconds. In at least one embodiment, other forms of annealing include microwave annealing or hybrid microwave annealing.

In at least one embodiment, the microwave anneal process comprises heating for a fourth time duration of less than 3600 s at a microwave power of less than 1000 W.

Point defects such as oxygen vacancies may lead to increased electrical leakage in capacitor layers which may be detrimental to ferroelectric polarization and switching voltage. Oxygen vacancies and other point defects can also lead to ferroelectric domain-wall pinning. Pining can manifest in detrimental effects such as increased switching voltage and lead to early endurance failure of FE capacitor devices.

In at least one embodiment, dashed box 500A defines operations that are conducted by a first entity and fabrication of target at operation 132 may be carried out by a second entity such as external suppliers, where the second entity is different from the first entity.

In at least one embodiment, method 500 iterates (denoted by arrow 190) by implementing a model driven selection, modifying stoichiometric composition of the one or more targets in the successive one or more targets, procuring the successive one or more targets, and depositing a successive multi-layer stack, performing anneal, performing compositional and electrical measurements, matching measurements with target values, and determining whether measurement results are within the tolerance level of target values, until target results are obtained.

In at least one embodiment, in addition to making changes to composition of one or more layers in the multi-layered stack, additional layers may be added to the multi-layer stack at operation 140. In at least one embodiment, such layers may be formed in accordance with multi-layer stack 600 in FIG. 6.

Figure 6:
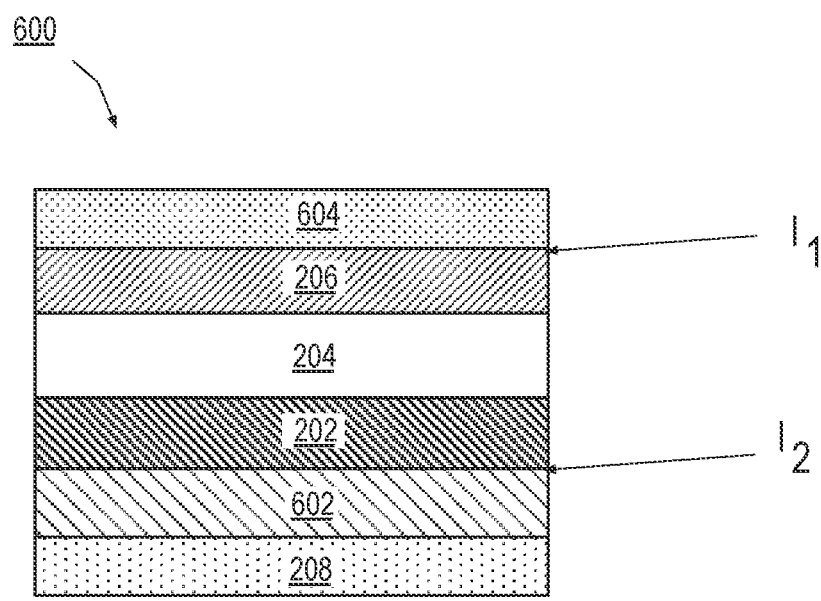
FIG. 6 is a cross-sectional illustration of a multi-layer stack including a ferroelectric material, deposited in accordance with the flow diagram in FIG. 1, in accordance with an embodiment of the present disclosure.

FIG. 6 is a cross-sectional illustration of a multi-layer stack 600 including a ferroelectric material, deposited in accordance with the flow diagram in FIG. 5, in accordance with at least one embodiment of the present disclosure. In at least one embodiment, layers in multi-layer stack 600 are deposited by a co-sputtering or a reactive sputtering method.

In at least one embodiment, additional conductive layers 602 and 604 may implemented for different purposes. In at least one embodiment, while conductive layer 202 was previously illustrated to be deposited on substrate 208 for test purposes, for device fabrication, conductive layer 202 may be coupled with interconnect structures. In at least one embodiment, conductive layer 202 may also be in contact with one or more insulator layers. In at least one embodiment, it may be useful for conductive layer 202 to have a crystallographic structure for templating of dielectric 204. In at least one embodiment, for this reason, among others, conductive layer 202 may be deposited on a secondary electrode layer, such as conductive layer 602. In at least one embodiment, conductive layer 602 includes Pt. In at least one embodiment, conductive layer 604 includes TaN. In at least one embodiment, conductive layers 602 and 604 can be deposited in-situ with the ferroelectric material to prevent interfacial layers $I_1$ and $I_2$ from forming between conductive layer 602 and conductive layer 202, and between conductive layer 206 and conductive layer 604, respectively.

In at least one embodiment, additional layers can aid some structural properties that can be overall detrimental to electrical resistance of the stack. In at least one embodiment, an increase in electrical resistance can detrimentally impose a need for higher operating voltages. In at least one embodiment, higher operating voltages may demand more powerful transistors. In at least one embodiment, the choice of materials may add little electrical resistance while providing crystallographic templating advantages. In at least one embodiment, determining a requisite minimum thickness that can provide compositional benefits should also be balanced with other parameters such as total stack thickness, ease of patterning, and development of interfacial layers during device fabrication process. Iterative device development must be carefully balanced with end goals of electrical requirements.

In at least one embodiment, patterning of multi-layer stack to fabricate devices further introduces other complexities and iterative methods as described above which are essential to rapid development.

Figure 7:
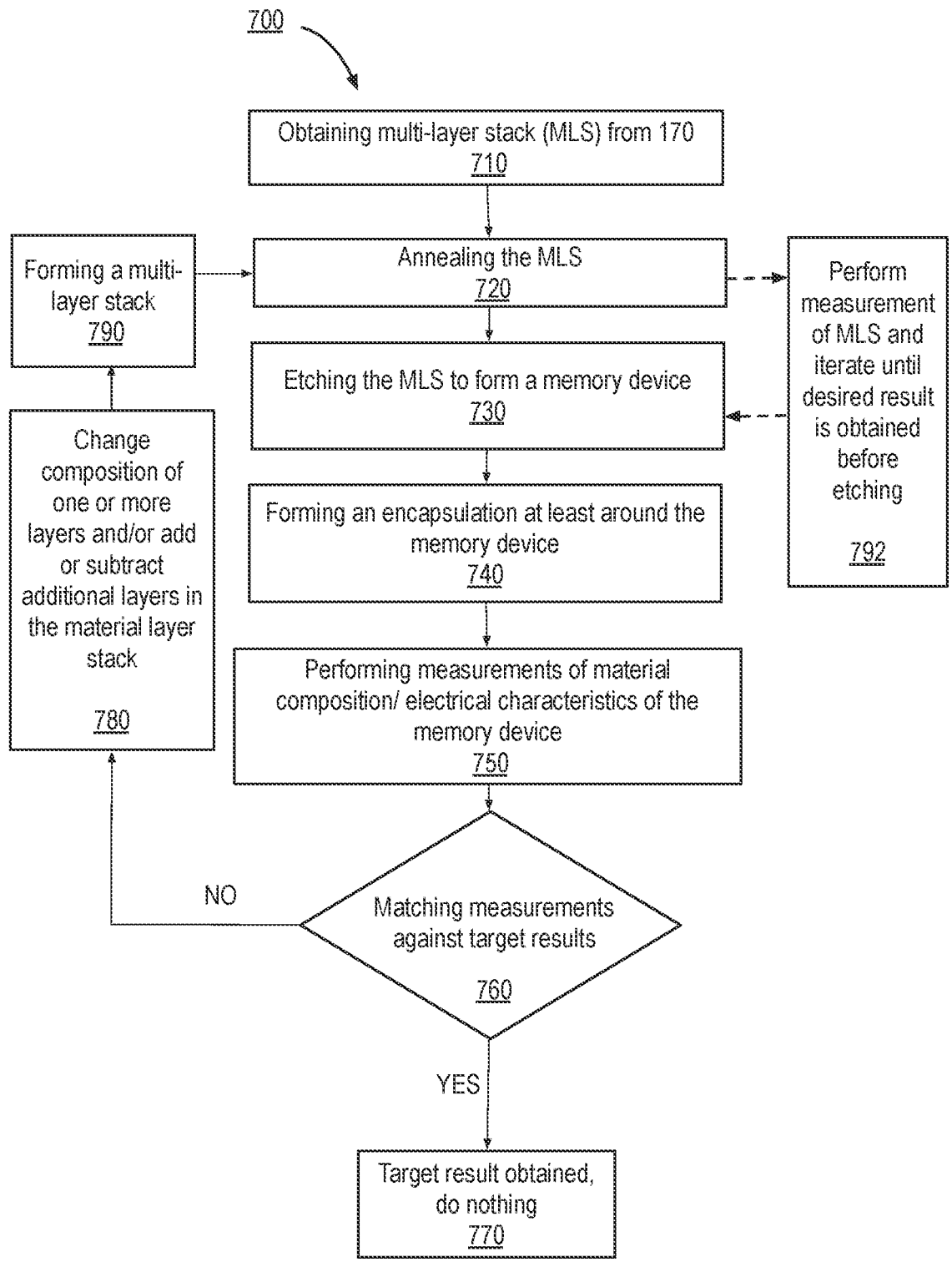
FIG. 7 is a flow diagram of a method of iteratively developing a memory device, in accordance with an embodiment of the present disclosure.

FIG. 7 is a flow diagram of method 700 of iteratively developing memory devices, in accordance with at least one embodiment of the present disclosure. In at least one embodiment, method 700 begins at operation 710 by receiving a multi-layer stack from operation 170 (FIG. 5). In at least one embodiment, method 700 continues at operation 720 with annealing the multi-layer stack. In at least one embodiment, method 700 continues at operation 730 by etching the multi-layer stack to form a memory device. In at least one embodiment, method 700 continues at operation 740 forming an encapsulation layer at least around the memory device. In at least one embodiment, method 700 continues at operation 750 by performing measurements of chemical composition and electrical properties of the memory device.

In at least one embodiment, method 700 continues at operation 760 by matching measurements of chemical composition and electrical properties of the memory device against target results and determining whether the measurements are within a tolerance level of the target results. In at least one embodiment, method 700 may end at operation 770 if measurements are within a tolerance level of the target results. In at least one embodiment, method 700 can continue at operation 780 by making modifications in response to determining that the measurements are not within the tolerance level. In at least one embodiment, modifications include changing composition of one or more layers in the initial multi-layer stack to form a successive multi-layer stack by implementing a model driven selection, modifying the single elements or the combination of elements in a successive one or more targets to comprise a respective second stoichiometric composition and procuring the successive one or more targets. In at least one embodiment, method 700 continues at operation 790 with forming a multi-layer stack. In at least one embodiment, method 700 iterates at operation 720 with annealing the multi-layer stack, etching the multi-layer stack, etching and forming a memory device, encapsulating the memory device, performing measurements, matching measurements, and determining whether the measurement results are within the tolerance level, until target results are obtained.

In at least one embodiment, after annealing the multi-layer stack that has been deposited after a first round of iterations, measurements can be made at operation 792 after operation 720 to assess if material composition and electrical characteristics are within tolerance of a desired target. In at least one embodiment, measurements made immediately after annealing at operation 720 can save time that would otherwise be spent in continuing with fabrication of devices and discovering results at end of line. In at least one embodiment, operation 792 is eliminated and measurements are made at end of line in a fabrication sequence, after devices are fabricated.

In at least one embodiment, in addition to making changes to composition of one or more layers in the multi-layered stack, additional layers may be added to the multi-layer stack. In at least one embodiment, such layers may be formed in accordance with the multi-layer stack 600 in FIG. 6.

FIG. 8A is a cross-sectional illustration of a planar capacitor (herein memory device 801) obtained by patterning the multi-layer stack obtained from operation 780 in FIG. 7. In at least one embodiment, multilayer stack may have properties of stack 200' or 200" in FIGS. 3A-3B, for example, conductive layer 202, dielectric 204, and conductive layer 206.

Referring again to FIG. 8A, in at least one embodiment, memory device 801 includes electrode 802, dielectric layer 804 on electrode 802, and electrode 806 on dielectric layer 804.

In at least one embodiment, electrode 802 comprises a first conductive nonlinear polar material where the first conductive nonlinear polar material has a first grain size. In at least one embodiment, dielectric layer 804 comprises a perovskite material comprising a second grain size. In at least one embodiment, electrode 806 comprises a second conductive nonlinear polar material, where the second conductive nonlinear polar material has a third grain size that is substantially the same as the first grain size or the second grain size. All grain sizes are defined by an "average grain length."

In at least one embodiment, perovskite film properties needed for high performance devices further necessitate achieving a grain size that is conducive for increasing effective polarization in the dielectric layer. In at least one embodiment, modulation of grain size may be accomplished by performing an anneal process at high temperatures.

In at least one embodiment, electrode 802 includes a perovskite material. In at least one embodiment, the perovskite material includes one of a non-Pb perovskite metaloxide, such as but not limited to, La—Sr—CoO$_3$, SrRuO$_3$, La—Sr—MnO$_3$, YBa$_2$Cu$_3$O$_7$, Bi$_2$Sr$_2$CaCu$_2$O$_8$, LaNiO$_3$, or DyScO3. In at least one embodiment, electrode 802 has a nanocrystalline to polycrystalline grain structure. In at least one embodiment, grains 802A may be irregular as illustrated. In at least one embodiment, grains 802A have a size defined by average length $L_1$. In at least one embodiment, $L_1$ ranges between 15 nm and 50 nm.

In at least one embodiment, grains 806A have a size defined by average length $L_2$. In at least one embodiment, $L_1$ and $L_2$ are substantially equal. In at least one embodiment, electrode 806 includes grains 806A that are of comparable magnitude to grains 802A of electrode 802. In at least one embodiment, $L_2$ ranges between 15 nm and 50 nm. In at least one embodiment, ratio $L_1$:L4, between grain size of electrodes 802 and 806, is substantially 1:1, but can vary by less than 10% percent.

In at least one embodiment, electrode 806 can further include a same material as the material of electrode 802. In at least one embodiment, substantially identical materials can provide symmetry and can offer additional advantages, such as reliability, as devices are cycled billions of times over a lifetime of operation. In at least one embodiment, different electrode materials having substantially the same grain size can be implemented in memory device 801. In at least one embodiment, this can be advantageous in some operational regimes where at least one of the electrodes 802 or 806 is coupled with an external circuit element such as a transistor.

In at least one embodiment, the dielectric layer 804 has a polycrystalline grain structure. In at least one embodiment, grains 804A may be irregular as illustrated. In at least one embodiment, grains 804A have a size defined by an average length $L_3$. In at least one embodiment, $L_3$ ranges between 15 nm and 50 nm. In at least one embodiment, multiple polarization domains may exist within grains 804A. In at least one embodiment, the ratio between $L_1$ and $L_3$ can range between 1:3 and 3:1. In at least one embodiment, the ratio between $L_1$ and $L_3$ is substantially equal to 1:1, when dielectric layer 804 includes one or more of the elements of electrode 802.

In at least one embodiment, while grain size is one attribute of the layers within memory device 801, there are others, such as point defects. In at least one embodiment, point defects are sites with missing atoms such as oxygen, or missing cations such as Ba, Bi, Fe, and/or Ti, etc. In at least one embodiment, point defects 803, 805, and 807 are illustrated by points within electrode 802, dielectric layer 804, and electrode 806, respectively. In at least one embodiment, point defects 803, 805, and 807 can correlate with grain size, where a layer comprising a large grain size may have lower point defect.

In at least one embodiment, electrode 802 has point defects 803 that number less than 1e20 atoms/cm$^3$. In at least one embodiment, electrode 802 has a grain size between 15 nm and 50 nm and point defects that number less than 1e20 atoms/cm$^3$. In at least one embodiment, dielectric layer 804 has point defects 805 that number less than 1e20 atoms/cm$^3$. In at least one embodiment, dielectric layer 804 has a grain size between 15 nm and 50 nm and point defects 805 that number less than 1e20 atoms/cm$^3$. In at least one embodiment, electrode 806 has a grain size between 15 nm and 50 nm and point defects 807 that number less than 1e20 atoms/cm$^3$.

In at least one embodiment, memory device 801 may be coupled with external circuit elements such as transistors through interconnect structures. In at least one embodiment, transition electrode 810 is below electrode 802. In at least one embodiment, transition electrode 810 may include a material such as TiN, W, Ru, TaN, or Ta. In at least one embodiment, transition electrode 810 can provide a surface for crystal templating of material of electrode 802.

In at least one embodiment, controlling grain sizes of electrodes and dielectric layers can modulate intrinsic behavior; which is equally useful for long term device performance to mitigate damage from extrinsic processes. In at least one embodiment, FeRAM devices including lead-free perovskite materials may be prone to damage from reaction with hydrogen during processing. The damage may be a result of hydrogen traveling along grain boundaries between or along electrodes coupled with two terminals of a FeRAM device. Hydrogen can cause reduction when it reacts with the one or more materials of the FeRAM device, such as the electrodes or the ferroelectric material itself. During fabrication anneal operations carried to tie up dangling bonds can be sources of hydrogen. FeRAM devices can lose their polarization hysteresis characteristics because of hydrogen reduction.

In at least one embodiment, where memory device 801 has a planar structure where the individual layers are sequentially layered one on top of another, it is useful to protect capacitor sidewalls, top and bottom surfaces from reacting with hydrogen. In at least one embodiment, solutions against hydrogen diffusion include forming an insulating barrier layer, silicon nitride, to protect sidewalls and top surfaces. In at least one embodiment, a contact electrode may be formed on a top of the memory device 801 by etching through the insulating barrier layer and exposing electrode 806.

FIG. 8B is a cross-sectional illustration of plurality of memory devices 820, where individual memory devices 801 are encapsulated by encapsulation layer 812, in accordance with at least one embodiment. In at least one embodiment, to prevent hydrogen from reaching dielectric layer 804, memory device 801 may be at least laterally covered by encapsulation layer 812. In at least one embodiment, sidewall 813 of the memory device 801 is laterally surrounded by encapsulation layer 812. In at least one embodiment, encapsulation layer 812 also extends partially on an uppermost surface of memory device 801(X and Z being respectively the x-axis and the z-axis of the plurality of memory devices 820).

In at least one embodiment, the process utilized to deposit encapsulation layer 812 can depend on materials utilized, and on a height of memory device 801. In at least one embodiment, which includes a plurality of memory devices, the deposition process can be dependent on relative spacing $S_D$ between adjacent memory devices. In at least one embodiment, the deposition process utilized to deposit encapsulation layer 812 does not include hydrogen or ammonia containing chemicals to prevent hydrogen exposure to layers within memory device 801. In at least one embodiment, encapsulation layer 812 is blanket deposited.

In at least one embodiment, encapsulation layer 812 includes an insulator material. In at least one embodiment, the insulator material can include a metal and oxygen, such as, but not limited to $Al_xO_y$, $HfO_x$, $AlSiO_x$, $ZrO_x$, or $TiO_x$. In at least one embodiment, materials such as $Al_xO_y$, $HfO_x$, $AlSiO_x$, $ZrO_x$, or $TiO_x$ can be deposited without a hydrogen or an ammonia containing chemical precursor in an ALD deposition process. In at least one embodiment, encapsulation layer 812 may be deposited to a thickness in the range of 0.5 nm to 10 nm. In at least one embodiment, encapsulation layer 812 may be deposited to a thickness of less than 5 nm. In at least one embodiment, an ALD process can provide a substantially conformal thickness on sidewalls of memory device 801. In at least one embodiment, a PVD deposition process may not conformally deposit encapsulation layer 812 with a uniform thickness.

In at least one embodiment, a PVD process may be utilized. In at least one embodiment, encapsulation layer 812 can include materials such as compounds of nitrogen, and a transition metal such as, but not limited to, AlN, ZrN, HfN, or compounds of Si and O, and one or more of Al, Hf or Ta, such as, but not limited to, AlSiOx, HfSiOx, and TaSiOx. In at least one embodiment, a PVD process may not provide a substantially conformal deposition on sidewalls of memory device 801. In at least one embodiment, a thickness of approximately 2 nm may be sufficient to prevent hydrogen transport through encapsulation layer 812 that is deposited with a material density of at least 90%.

In at least one embodiment, the material of encapsulation layer 812 can be chosen based on the material of dielectric layer 804. In at least one embodiment, pairing encapsulation layer 812 with dielectric layer 804 can minimize lattice dislocations that can cause voids and potential pathways for hydrogen diffusion.

In at least one embodiment, hydrogen may diffuse to electrodes 806 and 802 through one or more materials of a contact electrode and transition electrode 810 respectively. In at least one embodiment, to protect against hydrogen diffusion through a top surface of electrode 806, noble metals can be implemented on electrode 806.

In at least some embodiments, hydrogen can also diffuse from layers below electrode 802. In at least one embodiment, electrode 802 may be physically isolated from a conductive interconnect by transition electrode 810. In at least one embodiment, transition electrode 810 may be laterally surrounded by insulator layer 808 that can act as a barrier against hydrogen diffusion as well as provide etch stop capability while patterning to form memory device 801.

In at least one embodiment, to prevent hydrogen from diffusing directly into sidewalls of transition electrode 810, an insulator including an amorphous material may be directly in contact with the sidewalls of transition electrode. In at least one embodiment, an amorphous material may have a high film density (for example, a film density above 90% of theoretical material density or film density).

In at least one embodiment, an iterative method described above may be useful for choosing a type of material for encapsulation layer 812 as well as for understanding which deposition technique to adopt.

In at least one embodiment, dielectric 204 can dictate the choice of encapsulation layer 812. In at least one embodiment, encapsulation layer 812 may be chosen to have a Young's modulus similar to the Young's modulus of dielectric 204. In at least one embodiment, encapsulation layer 812 may be chosen to have a low probability of presence of defects at the interface between encapsulation layer 812 and dielectric 204. In at least one embodiment, encapsulation layer 812 can have a lower dielectric constant than the dielectric constant of dielectric 204 to enable field lines to be concentrated between conductive layer 202 and conductive layer 206.

In at least one embodiment, where dielectric 204 includes a $Pb_xZr_{1-x}Ti_yO_3$ group of families, encapsulation layer 812 can include $Al_xO_y$, $HfO_x$, $ZrO_x$, $TaO_x$, or $TiO_x$. In some embodiments, where dielectric 204 includes a $La_xBi_{1-x}Fe_yO_3$ group of families, encapsulation layer 812 can include $Al_xO_y$, $HfO_x$, $ZrO_x$, $TaO_x$, or $TiO_x$. In at least one embodiment, where dielectric 204 includes a $BaTiO_3$ group of families, encapsulation layer 812 can include $Al_xO_y$, $HfO_x$, $ZrO_x$, $TaO_x$, or $TiO_x$. In at least one embodiment, where dielectric 204 includes a BiFeO$_3$ group of families, encapsulation layer 812 can include Al$_x$O$_y$, HfO$_x$, ZrO$_x$, TaO$_x$, or TiO$_x$.

Figure 9:
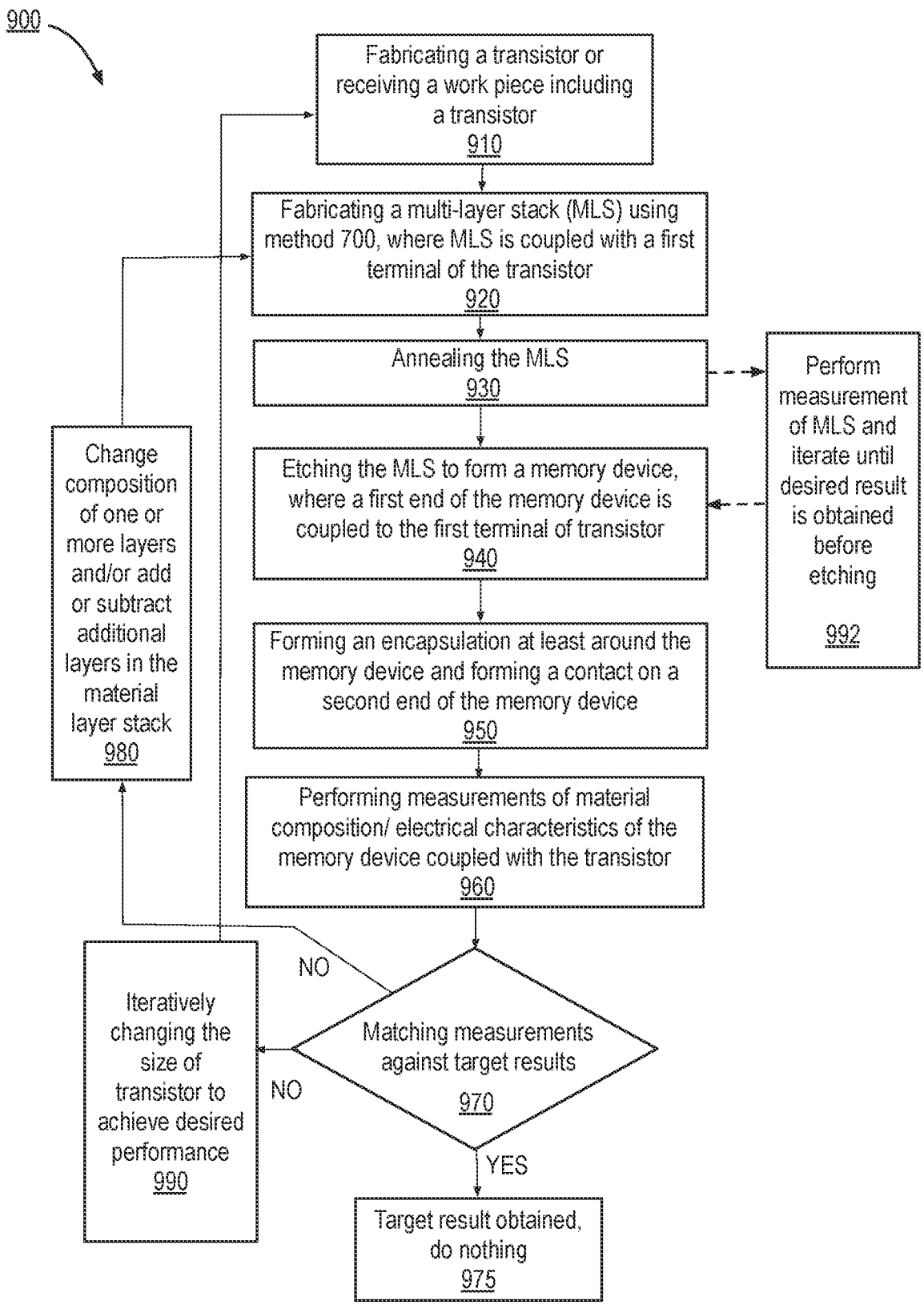
FIG. 9 is a flow diagram of a method of iteratively developing a memory device coupled with transistor, in accordance with an embodiment of the present disclosure.

FIG. 9 is a flow diagram of method 900 of iteratively developing a 1-Transistor-1-Memory cell, in accordance with at least one embodiment of the present disclosure. In at least one embodiment, method 900 begins at operation 910 by fabricating a transistor or receiving a workpiece that includes a transistor (for example purchased from a third party). In at least one embodiment, method 900 continues at operation 920 by fabricating a multi-layer stack using method 900 described in association with FIG. 7. Referring again to FIG. 9, the multi-layer stack is coupled with a first terminal of the transistor. In at least one embodiment, method 900 continues at operation 930 by annealing the multi-layer stack. In at least one embodiment, method 900 continues at operation 940 by etching the multi-layer stack to form a memory device, where a first terminal of the memory device is coupled with the first terminal of the transistor. In at least one embodiment, method 900 continues at operation 950 by forming an encapsulation at least around the memory device and forming a contact on a second end of the memory device. In at least one embodiment, the second terminal is above the first terminal. In at least one embodiment, method 900 continues at operation 960 by performing measurements of chemical composition and electrical properties of the memory device coupled with the transistor. In at least one embodiment, method 900 continues at operation 970 by matching measurements of compositional and electrical characterization of the memory device coupled with the transistor against target results for a reference memory device coupled with a reference transistor.

In at least one embodiment, method 900 may end at operation 975 if, after matching measurements against target results, the measurements are within a tolerance level of the target results. In at least one embodiment, if after matching measurements against target results the measurements are not within a tolerance level of the target results, method 900 continues at operation 980 by making modifications in response to determining that the measurements are not within the tolerance level. In at least one embodiment, modifications include changing composition of one or more layers in the initial multi-layer stack to form a successive multi-layer stack by implementing a model driven selection, modifying the single elements or the combination of elements in a successive one or more targets to comprise a respective second stoichiometric composition, and procuring the successive one or more targets. In at least one embodiment, or one or more additional layers can be added or removed.

In at least one embodiment, method 900 iterates at operation 920 with fabricating a successive multi-layer stack, annealing the successive multi-layer stack, etching the successive multi-layer stack, etching and forming a memory device, encapsulating the memory device, performing measurements, matching measurements, determining whether the measurement results are within the tolerance level, and repeating until target results are obtained.

In at least one embodiment, method 900 continues at operation 990 by changing the size of transistor to achieve a desired performance. In at least one embodiment, transistor characteristics to be changed include saturation current, operational voltage, gate voltage and physical dimensions. In at least one embodiment, the transistor may be fabricated or purchased from a third party.

In at least one embodiment, after annealing the multi-layer stack that has been deposited after a first round of iterations, measurements can be made at operation 992 to assess if material composition and electrical characteristics are within tolerance of a desired target. In at least one embodiment, measurements made after annealing can save time that would be spent in continuing with fabrication of device. In at least one embodiment, operation 992 can be eliminated and measurements are made after devices are fabricated.

Figure 10:
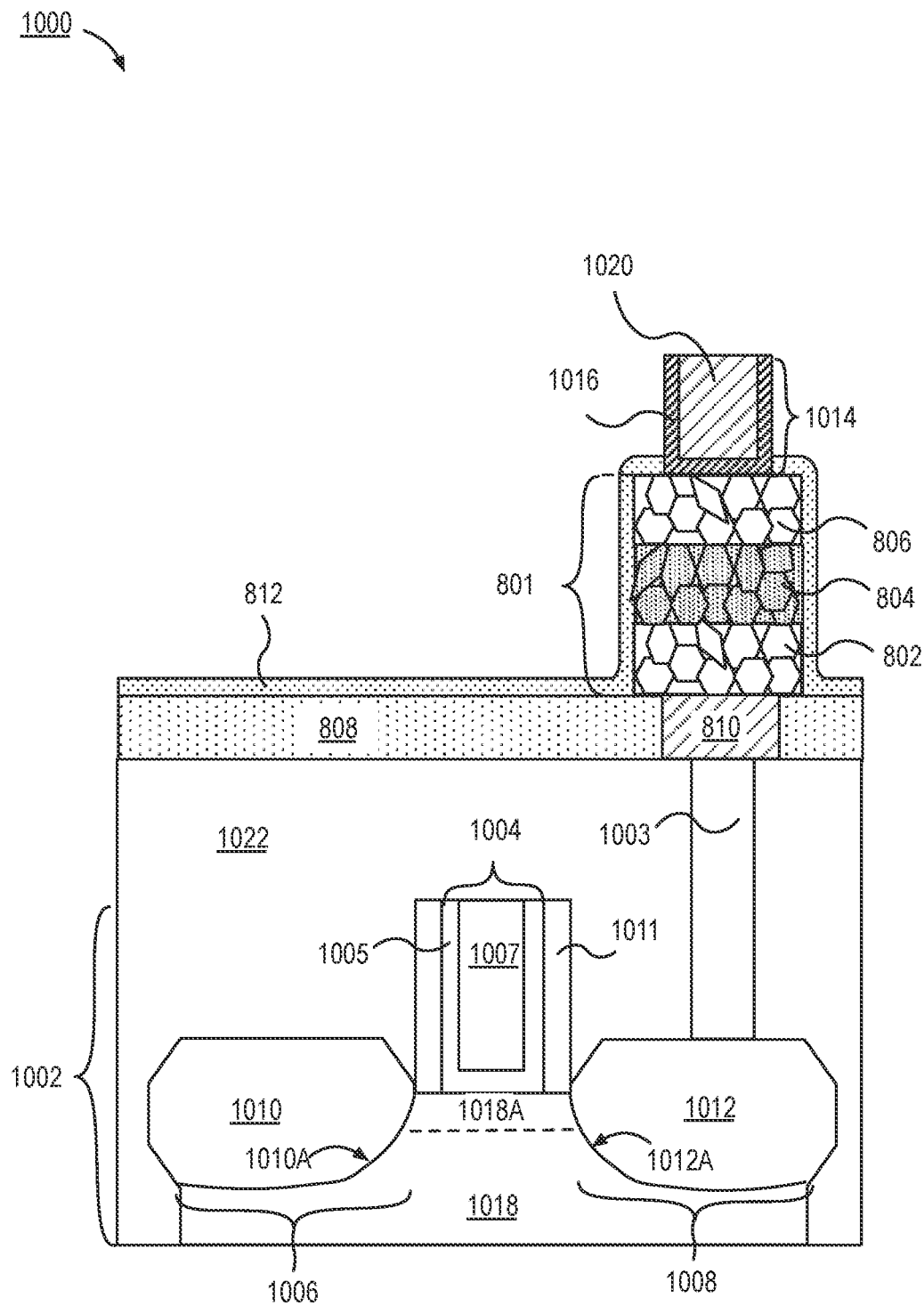
FIG. 10 is a cross-sectional illustration of a 1T-1C transistor device, in accordance with an embodiment of the present disclosure.

FIG. 10 is a cross-sectional illustration of system 1000 that includes a memory device 801 coupled with transistor 1002, in accordance with at least one embodiment. In at least one embodiment, memory device 801 is coupled to transistor 1002 through drain contact 1003. In at least one embodiment, memory device 801 includes one or more features of memory device 801 (FIG. 8A). In at least one embodiment, memory device 801 is on a transition electrode 810. In at least one embodiment, transition electrode 810 is coupled with drain contact 1003 of transistor 1002.

In at least one embodiment, memory device 801 can be a planar capacitor (FIG. 8A) or a trench capacitor In at least one embodiment, memory device 801 have a cylindrical profile. In at least one embodiment, memory device 801 can have a rectangular profile. In at least one embodiment, while memory device 801 is electrically coupled with drain contact 1003, there may be intervening layers of via electrodes between drain contact 1003 and transition electrode 810.

In at least one embodiment, transistor 1002 is an example of a transistor that is non-planar. In at least one embodiment, transistor 1002 may be, an NMOS or a PMOS transistor. In at least one embodiment, transistor 1002 includes gate structure 1004, between source region 1006 and drain region 1008. In at least one embodiment, source region 1006 includes epitaxial source structure 1010 (herein source structure 1010) and drain region 1008 includes epitaxial drain structure 1012 (herein drain structure 1012). In at least one embodiment, source structure 1010 and drain structure 1012 are separated from gate structure 1004 by spacer 1011 and have faceted sidewall surfaces 1010A and 1012A. Not all faceted surfaces of source structure 1010 and drain structure 1012 are shown. In at least one embodiment, a portion of gate structure 1004 is on dielectric 1022 that separates gate structure 1004 from substrate 1018. In at least one embodiment, drain contact 1003 is coupled to drain structure 1012.

In at least one embodiment, gate structure 1004 further includes gate dielectric layer 1005 and gate electrode 1007. In at least one embodiment, gate dielectric layer 1005 has a base portion on channel 1018A and sidewall portions that are adjacent to spacer 1011. In at least one embodiment, gate electrode 1007 is confined within gate dielectric layer 1005.

In at least one embodiment, gate dielectric layer 1005 includes a suitable gate dielectric material such as but not limited to: an oxide of one or more of: Si, Hf, Zr, La, Ti, Ta, or Ga; or Al, such as SiO$_2$, HfO$_2$, ZrO$_2$, HfSiO$_x$, HfZrO$_2$, Ta$_2$O$_5$, Al$_2$O$_3$, La$_2$O$_3$, or TaSiO$_x$; or Ga$_2$O$_5$. In at least one embodiment, gate electrode 1007 may include one or more of: Ti, Al, W, Pt, Co, Ni, or Pd; nitrogen; one or more of: Ti, Ta, Al, Hf, or Zr; or carbon and one or more of: Ti, Al, Ta, Hf, or Zr. In at least one embodiment, source structure 1010 and drain structure 1012 may include amorphous Si, SiC, SiGe, or Ge and may be doped with As, P, or B, depending on the mobile charge carrier implemented. In at least one embodiment, spacer 1011 includes silicon nitride or silicon nitride doped with carbon. In at least one embodiment, drain contact 1003 includes a conductive material such as Ru, Ti, Co, Mo, Co, Ni, W, or Ta; or nitrides of Ti, W, or Ta. In at least one embodiment, drain contact 1003 includes a liner layer including TiN, TaN, or WN; and a fill metal including one or more of: Ru, Ti, Co, Mo, Co, Ni, W, or Ta.

In at least one embodiment, memory device 801 may be further coupled with a contact structure 1014. In at least one embodiment, contact structure 1014 is coupled with electrode 806. In at least one embodiment, contact structure 1014 may include conductive hydrogen barrier 1016 that surrounds a fill material 1020. In at least one embodiment, conductive hydrogen barrier 1016 is in contact with encapsulation layer 812. In at least one embodiment, encapsulation layer 812 and conductive hydrogen barrier 1016 together provide a barrier to memory device 801.

In at least one embodiment, conductive hydrogen barrier 1016 includes a material that is amorphous. In at least one embodiment, amorphous materials lack defined grain boundaries that can facilitate hydrogen diffusion and are thus desirable. In at least one embodiment, conductive hydrogen barrier 1016 includes materials such as, but not limited to: TiAlN, with >30 atomic percent AlN; TaN, with >30 atomic percent $N_2$; TiSiN, with >20 atomic percent SiN; Ta carbide, Ti carbide, TiC; tungsten carbide; tungsten nitride; carbonitrides of Ta, Ti, or W, i.e., TaCN, TiCN, or WCN; titanium monoxide; $Ti_2O$; tungsten oxide, Tin oxide; indium tin oxide; iridium oxide; indium gallium zinc oxide; zinc oxide, or METGLAS series of alloys, e.g., $Fe_{40}Ni_{40}P_{14}B_6$. In at least one embodiment, conductive hydrogen barrier 1016 has a thickness that is less than 5 nm.

In at least one embodiment, transition electrode 810 includes a material that provides a barrier against hydrogen and oxygen diffusion. In at least one embodiment, transition electrode 810 does not include a material that provides a barrier against hydrogen and oxygen diffusion. In at least one embodiment, the transition electrode can be laterally surrounded by a conductive hydrogen barrier layer such as conductive hydrogen barrier 1016.

In other embodiments, encapsulation layer 812 can include materials that are oxygen diffusion barriers. Examples of oxygen diffusion barrier material includes silicon nitride and silicon carbide.

In at least one embodiment, the iterative method described in FIG. 9, may be utilized to determine the choice of materials for encapsulation layer 812, conductive hydrogen barrier 1016, optimization of drive current, threshold voltage, and/or on-off characteristics (among other parameters) of transistor 1002.

Reference in the specification to "an embodiment," "one embodiment," "some embodiments," "other embodiments," or "at least one embodiment," generally means that a particular feature, structure, or characteristic described in connection with the embodiments may be included at least one embodiment, but not necessarily all embodiments. The various appearances of "an embodiment," "one embodiment," "at least one embodiment," or "some embodiments" are not necessarily all referring to the same embodiments. If the specification states a component, feature, structure or characteristic "may," "might," or "could" be included, that component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the features, structures, functions, or characteristics may be combined in any suitable manner in at least one embodiment. In at least one embodiment, a first embodiment may be combined with a second embodiment anywhere the features, structures, functions or characteristics associated with the two embodiments are not mutually exclusive.

The structures of at least one embodiment described herein can also be described as method(s) of forming those structures or apparatuses, and method(s) of operation of these structures or apparatuses. In at least one embodiment, the method may be an iterative method. Following are examples that illustrate at least one embodiment. The examples can be combined with other examples: at least one embodiment can be combined with another embodiment without changing the scope of the disclosure.

Example 1: A method comprising: determining a target multi-layer stack, wherein the target multi-layer stack comprises a polar material; implementing a model driven target selection based on a charge:mass ratio and a magnetic moment:mass ratio of target materials; procuring an initial one or more targets, wherein individual targets in the initial one or more targets comprise single elements or a combination of elements with a respective initial stoichiometric composition; depositing, using the initial one or more targets, an initial multi-layer stack; performing measurements of chemical composition and electrical properties of the initial multi-layer stack; modifying, in response to determining that measurement results are not within tolerance levels of target results, composition of one or more layers in the initial multi-layer stack; and iterating depositing of a successive multi-layer stack and determining whether the measurement results of the successive multi-layer stack are within the tolerance levels, until target results are obtained.

Example 2: The method of example 1, wherein modifying composition of one or more layers in the initial multi-layer stack further comprises: implementing the model driven target selection based on the charge:mass ratio and the magnetic moment:mass ratio of the target materials; modifying stoichiometric composition of one or more targets in a successive one or more targets; and procuring the successive one or more targets.

Example 3: The method of example 1, wherein after depositing the successive multi-layer stack, the method further comprises: performing measurements of chemical composition and electrical properties of the successive multi-layer stack; and matching measurements of chemical composition and electrical properties of the successive multi-layer stack against target results.

Example 4: The method of example 1, wherein depositing the initial multi-layer stack comprises: depositing a first conductive layer comprising a first conductive material, wherein the first conductive material comprises one of (La,Sr)FeO$_3$, (La,Sr)CoO$_3$, (La,Ca)MnO$_3$, (La,Sr)MnO$_3$, SrRuO$_3$, Sr$_2$RuO$_4$, (Ba,Sr)RuO$_3$, SrMoO$_3$, (La,Sr)MnO$_3$, SrCoO$_3$, SrCrO$_3$, SrFeO$_3$, SrVO$_3$, CaMoO$_3$, SrNbO$_3$, LaNiO$_3$, YBa$_2$Cu$_3$O$_7$, Bi$_2$Sr$_2$CaCuO$_8$, CaRuO$_3$, Ir, Ir$_2$O$_x$, Ru, RuO$_x$, Mo, MoO$_x$, W, or WO$_x$; depositing a dielectric layer on the first conductive layer, the dielectric layer comprising one of: a perovskite material which includes one of: BaTiO$_3$, PbTiO$_3$, KNbO$_3$, or NaTaO$_3$; lead zirconium titanate (PZT), or PZT with a first doping material, wherein the firsy doping material is one of La or Nb; bismuth ferrite (BFO) with a second doping material, wherein the second doping material is one of lanthanum, elements from lanthanide series of a periodic table, or elements of a 3d, 4d, 5d, 6d, 4f, and 5f series of the periodic table; a relaxor ferroelectric material which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); a hexagonal ferroelectric which includes one of: $YMnO_3$ or $LuFeO_3$; hexagonal ferroelectrics of a type h-$RMnO_3$, wherein R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides; hafnium oxides as Hf(1-x)ExOy, where E can be Al, Ca, Ce, Dy, Er, Gd, Ge, La, Sc, Si, Sr, Sn, Zr, or Y; Al(1-x)Sc(x)N, Ga(1-x)Sc(x)N, Al(1-x) Y(x)N, or Al(1-x-y)Mg(x)Nb(y)N Al(1-x)Sc(x)N,Ga(1-x)Sc(x)N, Al(1-x)Y(x)N or Al(1-x-y) Mg(x)Nb(y)N, y doped $HfO_2$, where x includes one of: Al, Ca, Ce, Dy, Er, Gd, Ge, La, Sc, Si, Sr, Sn, or Y, wherein 'x' is a fraction; or niobate type compounds $LiNbO_3$, $LiTaO_3$, lithium iron tantalum oxyfluoride, barium strontium niobate, sodium barium niobate, or potassium strontium niobate; or an improper ferroelectric material which includes one of: [PTO/STO]n or [LAO/STO]n, wherein 'n' is between 1 and 100, or a paraelectric material that comprises $SrTiO_3$, Ba(x) Sr(y)TiO3, $HfZrO_2$, Hf—Si—O, La-substituted $PbTiO_3$, or PMN-PT based relaxor ferroelectrics; and depositing a second conductive layer comprising a second conductive non-linear polar material, wherein the second conductive non-linear polar material comprises one of (La,Sr)$FeO_3$, (La,Sr)$CoO_3$, (La,Ca)$MnO_3$, (La,Sr)$MnO_3$, $SrRuO_3$, $Sr_2RuO_4$, (Ba,Sr)$RuO_3$, $SrMoO_3$, (La,Sr)$MnO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, Ir2Ox, Ru, $RuO_x$, Mo, $MoO_x$, W or $WO_x$.

Example 5: The method of example 1, wherein the initial one or more targets comprise one or more of: Bi, Fe, O, La, Mn and Sc.

Example 6: The method of example 2, wherein compounds in the successive one or more targets comprise Bi, Fe, and O, wherein individual stoichiometry within compounds comprising two or more of Bi, Fe and O, can be different by between 5% and 10% from compounds comprising two or more of Bi, Fe and O, in the initial one or more targets, and wherein individual ones of the one or more targets comprise between 85% to 95% theoretical material density.

Example 7: The method of example 1, wherein the initial one or more targets includes elemental targets of Bi and Fe, wherein the elemental targets include a purity of at least 99.5%, and wherein the depositing further comprises depositing in a gas comprising one or more of: Ar, $O_2$, $N_2$, $H_2$, Kr, and Ne.

Example 8: The method of example 1, wherein depositing comprises depositing using a physical vapor deposition tool.

Example 9: The method of example 1, wherein prior to performing measurements, the method further comprises performing a post deposition anneal (PDA).

Example 10: The method of example 9, wherein performing the PDA comprises: utilizing a rapid thermal annealing process, wherein: the rapid thermal annealing process comprises heating to a first temperature of less than 700° Celsius, for a time duration between 1 s and 60 s, at a first pressure between vacuum and 760 Torr; the rapid thermal annealing process further comprises flowing $O_2$, $N_2$, or Argon gas while operating at the first pressure between 1 Torr and 760 Torr; or utilizing a flash anneal process; the flash anneal process comprises heating to a second temperature between 500° and 1300° Celsius, for a second time duration of less than 10 milliseconds, and at a second pressure between vacuum and 760 Torr; the flash anneal process further comprises flowing $O_2$, $N_2$, or Argon gas while operating at the second pressure between 1 Torr and 760 Torr; or utilizing a laser anneal process; the laser anneal process comprises heating to a third temperature of up to 1300° Celsius, for a third time duration of less than 100 microseconds, and at a third pressure between vacuum and 760 Torr; the laser anneal process further comprises flowing $O_2$, $N_2$, or Argon gas while operating at the third pressure between 1 Torr and 760 Torr; or utilizing a microwave anneal process, wherein the microwave anneal process comprises heating for a fourth time duration of less than 3600 s at a microwave power of less than 1000 W.

Example 11: A method comprising: receiving a multi-layer stack comprising a ferroelectric material obtained by utilizing an iterative stack development process; etching the multi-layer stack to form a memory device; performing measurements of compositional and electrical characterization of the memory device; modifying, in response to determining that measurement results are not within tolerance level of target results, composition of one or more layers in the multi-layer stack by utilizing the iterative stack development process; and iterating receiving of the multi-layer stack, etching the multi-layer stack to form a successive memory device, performing measurements of compositional and electrical characterization of the successive memory device, matching measurement of the successive memory device against target results for a memory device, until measurements are within a tolerance level of the target results for the memory device.

Example 12: The method of example 11, wherein the iterative stack development process comprises: determining a target multi-layer stack, wherein the target multi-layer stack comprises a polar material; implementing a model driven target selection based on a charge:mass ratio and a magnetic moment:mass ratio of target materials; procuring an initial one or more targets, wherein individual targets in the initial one or more targets comprise single elements or a combination of elements with a respective initial stoichiometric composition; depositing an initial multi-layer stack using the initial one or more targets; performing measurements of chemical composition and electrical properties of the initial multi-layer stack; determining whether measurement results are within a tolerance level of the target results; modifying, in response to determining that the measurement results are not within the tolerance level, stoichiometric composition of one or more targets in a successive one or more targets; and iterating depositing a successive multi-layer stack, determining whether measurement results of the successive multi-layer stack are within the tolerance level, until target results are obtained.

Example 13: The method of example 12, wherein depositing the initial multi-layer stack comprises: depositing a first conductive layer comprising a first conductive material, wherein the first conductive material comprises one of (La,Sr)$FeO_3$, (La,Sr)$CoO_3$, (La,Ca)$MnO_3$, (La,Sr)$MnO_3$, $SrRuO_3$, $Sr_2RuO_4$, (Ba,Sr)$RuO_3$, $SrMoO_3$, (La,Sr)$MnO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, Ir2Ox, Ru, $RuO_x$, Mo, $MoO_x$, W or $WO_x$; depositing a dielectric layer on the first conductive layer of the dielectric layer comprising one of: a perovskite material which includes one of: $BaTiO_3$, $PbTiO_3$, $KNbO_3$, or $NaTaO_3$; lead zirconium titanate (PZT) or PZT with a first doping material, wherein the first doping material is one of La or Nb; bismuth ferrite (BFO) with a second doping material, wherein the second doping material is one of lanthanum, elements from lanthanide series of a periodic table, or elements of a 3d, 4d, 5d, 6d, 4f and 5f series of the periodic table; a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); a hexagonal ferroelectric which includes one of: $YMnO_3$ or $LuFeO_3$; hexagonal ferroelectrics of a type h-$RMnO_3$, wherein R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides; Hafnium oxides as $Hf_{1-x}E_xO_y$, where E can be Al, Ca, Ce, Dy, Er, Gd, Ge, La, Sc, Si, Sr, Sn, Zr, or Y; Al(1-x)Sc(x)N, Al(1-x)Y(x)N, Ga(1-x)Sc(x)N, Al(1-x-y)Mg(x)Nb(y)N, or y doped $HfO_2$, where x includes one of: Al, Ca, Ce, Dy, Er, Gd, Ge, La, Sc, Si, Sr, Sn, or Y, wherein 'x' is a fraction; or niobate type compounds $LiNbO_3$, and $LiTaO_3$, lithium iron tantalum oxyfluoride, barium strontium niobate, sodium barium niobate, or potassium strontium niobate; or an improper ferroelectric material which includes one of: [PTO/STO]n or [LAO/STO]n, wherein 'n' is between 1 and 100, or a paraelectric material that comprises $SrTiO_3$, Ba(x)Sr(y)$TiO3$, $HfZrO_2$, Hf—Si—O, La-substituted $PbTiO_3$, or a PMN-PT based relaxor ferroelectrics; and depositing a second conductive layer comprising a second conductive nonlinear polar material, wherein the second conductive nonlinear polar material comprises one of (La,Sr)$FeO_3$, (La,Sr)$CoO_3$, (La,Ca)$MnO_3$, (La,Sr)$MnO_3$, $SrRuO_3$, $Sr_2RuO_4$, (Ba,Sr)$RuO_3$, $SrMoO_3$, (La,Sr)$MnO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, Ir2Ox, Ru, $RuO_x$, Mo, $MoO_x$, W or $WO_x$.

Example 14: The method of example 12, wherein compounds in the initial one or more targets comprise Bi, Fe, and O, wherein individual stoichiometry within compounds comprising two or more of Bi, Fe, and O, can be different by at least 5% from compounds comprising two or more of Bi, Fe, and O, in the initial one or more targets.

Example 15: The method of example 12, wherein the initial one or more targets includes elemental targets of Bi and Fe, wherein the elemental targets include a purity of at least 99.5%, and wherein depositing the initial multi-layer stack further comprises depositing in a gas comprising one or more of: Ar, $O_2$, $N_2$, $H_2$, Kr, and Ne.

Example 16: The method of example 11, wherein prior to etching the method further comprises annealing the multi-layer stack, wherein annealing comprises utilizing a rapid thermal annealing process, wherein the rapid thermal annealing process comprises heating to a first temperature of less than 700° Celsius, for a time duration between 1 s and 60 s, at a first pressure between vacuum and 760 Torr, and wherein the rapid thermal annealing process further comprises flowing $O_2$, $N_2$, or Argon gas while operating at the first pressure between 1 Torr and 760 Torr.

Example 17: The method of example 11, wherein the method further comprises forming an encapsulation layer directly surrounding the memory device, wherein the encapsulation layer comprises metal and oxygen, including one of $Al_xO_y$, $HfO_x$, $AlSiO_x$, $ZrO_x$, or $TiO_x$, wherein $Al_xO_y$, $HfO_x$, $AlSiO_x$, $ZrO_x$, or $TiO_x$ are deposited without a hydrogen or ammonia containing chemical precursor in an ALD deposition process.

Example 18: A method comprising: fabricating a transistor or receiving a workpiece comprising a transistor; forming a memory device comprising a multi-layer stack, wherein the memory device is coupled with a gate or a drain of the transistor; performing measurements of compositional and electrical characterization of the memory device coupled with the transistor, and matching measurements against target results for a reference memory device coupled to a reference transistor; modifying, in response to determining that the measurements are not within a tolerance level of the target results for the reference memory device coupled to the reference transistor, composition of one or more layers in the multi-layer stack by utilizing an iterative stack development process; and iterating fabricating of the transistor or receiving the workpiece comprising the transistor, forming a successive memory device, performing measurements of compositional and electrical characterization of the successive memory device coupled with the transistor, matching measurement of the successive memory device coupled with the transistor against target results for the reference memory device coupled with the reference transistor, until measurements are within a tolerance level of the target results.

Example 19: The method of example 18, wherein the iterative stack development process comprises: determining a target multi-layer stack, wherein the target multi-layer stack comprises a ferroelectric material; implementing a model driven target selection based on a charge:mass ratio and a magnetic moment:mass ratio of target materials; procuring an initial one or more targets, wherein individual targets in the initial one or more targets comprise single elements or a combination of elements with a respective initial stoichiometric composition; depositing, using the initial one or more targets, an initial multi-layer stack; performing measurements of chemical composition and electrical properties of the initial multi-layer stack; matching measurements of chemical composition and electrical properties of the initial multi-layer stack against target results; determining whether measurement results are within a tolerance level of the target results; modifying, in response to determining that the measurement results are not within the tolerance level, stoichiometric composition of one or more targets in a successive one or more targets; and iterating depositing a successive multi-layer stack, determining whether measurement results of the successive multi-layer stack are within the tolerance level, until target results are obtained.

Example 20: The method of example 18, wherein forming the memory device comprises etching the multi-layer stack, and wherein the method further comprises forming an encapsulation around the memory device, prior to performing measurements of compositional and electrical characterization of the memory device coupled with the transistor.

Example 21: The method of example 19, wherein compounds in the successive one or more targets comprise Bi, Fe, and O, wherein individual stoichiometry within compounds comprising two or more of Bi, Fe, and O can be different by 5% from compounds comprising two or more of Bi, Fe, and O in the initial one or more targets.

Example 22: The method of example 18, wherein prior to etching the method further comprises annealing the multi-layer stack, wherein annealing comprises utilizing a rapid thermal annealing process, wherein the rapid thermal annealing process comprises heating to a first temperature of less than 700° Celsius, for a time duration between 1 s and 60 s, at a first pressure between vacuum and 760 Torr, and wherein the rapid thermal annealing process further comprises flowing $O_2$, $N_2$, or Argon gas while operating at the first pressure between 1 Torr and 760 Torr.

Example 23: The method of example 18, wherein the method further comprises forming an encapsulation layer directly surrounding the memory device, wherein the encapsulation layer comprises metal and oxygen, including one of: $Al_xO_y$, $HfO_x$, $AlSiO_x$, $ZrO_x$, or $TiO_x$, wherein $Al_xO_y$, $HfO_x$, $AlSiO_x$, $ZrO_x$, or $TiO_x$ are deposited without a hydrogen or ammonia containing chemical precursor in an ALD deposition process.

An abstract is provided that will allow the reader to ascertain the nature and gist of the technical disclosure. The abstract is submitted with the understanding that it will not be used to limit the scope or meaning of the examples. The following examples are hereby incorporated into the detailed description, with each example or feature of an example standing on its own as an embodiment.

What is claimed is:

1. A method comprising:
    choosing a target multi-layer stack, wherein the target multi-layer stack comprises first individual layers including a first electrode, a second electrode and a dielectric layer comprising an electrically polar material therebetween;
    procuring an initial one or more targets to form the target multi-layer stack;
    implementing a computational model to predict sputter yields and deposition rates for depositing individual layers based on the first individual layers after procuring the initial one or more targets;
    forming an initial multi-layer stack on a substrate by depositing the individual layers based on the first individual layers, wherein the depositing is based on the sputter yields and the deposition rates according to the computational model;
    performing an initial measurement of chemical composition of the dielectric layer, performing an initial measurement of electrical characterization including resistivity and/or work function of the first electrode and of the second electrode based on the first individual layers, and performing an initial measurement of electrical characterization of the initial multi-layer stack including switchable polarization versus applied electric field;
    comparing the initial measurement of chemical composition and the initial measurement of electrical characterization of the initial multi-layer stack with reference target values of the target multi-layer stack, and determining whether the initial measurement of chemical composition and the initial measurement of electrical characterization of the initial multi-layer stack are within respective tolerance levels of the reference target values;
    depositing, in response to determining that measurement results are not within the respective tolerance levels of the reference target values, a successive multi-layer stack, wherein the successive multi-layer stack comprises second individual layers including a third electrode, a second dielectric layer and a fourth electrode on a successive substrate by procuring a successive one or more targets for depositing the second individual layers;
    performing a successive measurement of chemical composition and a successive measurement of electrical characterization of the third electrode, the fourth electrode and the second dielectric layer in the successive multi-layer stack, wherein the successive measurement of chemical composition and the successive measurement of electrical characterization are a same type of measurement with the initial measurement of chemical composition of the dielectric layer, and a same type of measurement with the initial measurement of electrical characterization including resistivity and/or work function of the first electrode and of the second electrode; and
    when the successive measurement of chemical composition of the second dielectric layer, and the successive measurement of electrical characterization of the successive multi-layer stack are not within the respective tolerance levels of the reference target values of the target multi-layer stack, depositing a further successive multi-layer stack on a further successive substrate by procuring a further successive one or more targets for depositing respective individual layers in the further successive multi-layer stack, performing a further successive measurement of chemical composition, and a further successive measurement of electrical characterization of the further successive multi-layer stack until the reference target values of the target multi-layer stack are obtained within the respective tolerance levels, wherein the further successive measurement of chemical composition and the further successive measurement of electrical characterization are the same type of measurement with the initial measurement of chemical composition of the dielectric layer, and the same type of measurement with the initial measurement of electrical characterization including resistivity and/or work function of the first electrode and of the second electrode.

2. The method of claim 1, wherein combination of elements in the successive one or more targets has compositions that are different from compositions of the combination of elements in the initial one or more targets.

3. The method of claim 1, wherein depositing the further successive multi-layer stack further comprises:
    depositing a material of a fifth electrode;
    depositing a material of a third dielectric layer; and
    depositing a material of a sixth electrode on the third dielectric layer.

4. The method of claim 1, wherein depositing the initial multi-layer stack comprises:
    depositing a material of the first electrode comprising one of: $(La,Sr)FeO_3$, $(La,Sr)CoO_3$, $(La,Ca)MnO_3$, $(La,Sr)MnO_3$, $SrRuO_3$, $Sr_2RuO_4$, $(Ba,Sr)RuO_3$, $SrMoO_3$, $(La,Sr)MnO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, W or $WO_x$;
    depositing a material of the dielectric layer on the material of the first electrode, the material of the dielectric layer comprising one of:
    a perovskite material which includes one of: $BaTiO_3$, $PbTiO_3$, $KNbO_3$, or $NaTaO_3$;
    lead zirconium titanate (PZT), or PZT with a first doping material, wherein the first doping material is one of La or Nb;
    bismuth ferrite (BFO) with a second doping material, wherein the second doping material is one of lanthanum, elements from lanthanide series of a periodic table, or elements of a 3d, 4d, 5d, 6d, 4f, and 5f series of the periodic table;

a relaxor ferroelectric material which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or Barium titanium-barium strontium titanium (BT-BST);

a first hexagonal ferroelectric which includes one of: $YMnO_3$ or $LuFeO_3$;

a second hexagonal ferroelectric of a type h-$RMnO_3$, wherein R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides or their alloyed oxides;

hafnium oxides as $Hf_{(1-x)}E_xO_y$, where E is Al, Ca, Ce, Dy, Er, Gd, Ge, La, Sc, Si, Sr, Sn, Zr, or Y; $Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, wherein 'x' and 'y' are first fractions; or niobate type compounds $LiNbO_3$, $LiTaO_3$, lithium iron tantalum oxyfluoride, barium strontium niobate, sodium barium niobate, or potassium strontium niobate; or an improper ferroelectric material which includes one of: [PTO/STO]n or [LAO/STO]n, wherein 'n' is between 1 and 100, or a paraelectric material that comprises $SrTiO_3$, $Ba_{(x)}Sr_{(y)}TiO_3$, $HfZrO_2$, Hf—Si—O, La-substituted $PbTiO_3$, or a PMN-PT based relaxor ferroelectrics; and depositing a material of the second electrode comprising one of: $(La,Sr)FeO_3$, $(La,Sr)CoO_3$, $(La,Ca)MnO_3$, $(La,Sr)MnO_3$, $SrRuO_3$, $Sr_2RuO_4$, $(Ba,Sr)RuO_3$, $SrMoO_3$, $(La,Sr)MnO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, W or $WO_x$.

5. The method of claim 1, wherein the initial one or more targets utilized to deposit a material of the dielectric layer comprise two or more of Bi, Fe, O, La, Mn and Sc.

6. The method of claim 1, wherein the initial one or more targets comprises a first combination of elements, wherein depositing the successive multi-layer stack comprises utilizing the successive one or more targets comprising a second combination of elements, wherein the first combination of elements comprises two or more of Bi, Fe, and O, and wherein the second combination of elements comprises two or more of Bi, Fe and O, and wherein individual stoichiometry within the first combination of elements are different by between 5% and 10% from individual stoichiometry within the second combination of elements.

7. The method of claim 1, wherein the dielectric layer comprises $BiFeO_3$ and wherein the initial one or more targets comprise Bi and Fe, and wherein the Bi and Fe are greater than 99% pure elemental sputtering targets.

8. The method of claim 2, wherein forming the initial multi-layer stack comprises using a physical vapor deposition toolset and wherein depositing the successive multi-layer stack further comprises changing parameters including deposition power, pressure, temperature of chamber, on the physical vapor deposition toolset.

9. The method of claim 1, wherein prior to performing the initial measurement of chemical composition and the initial measurement of electrical characterization, the method further comprises performing a post deposition anneal (PDA).

10. The method of claim 9, wherein performing the PDA comprises:

utilizing a rapid thermal annealing process, wherein:

the rapid thermal annealing process comprises heating to a first temperature of less than 700 degrees Celsius, for a time duration between 1 s and 60 s, at a first pressure between vacuum and 760 Torr;

the rapid thermal annealing process further comprises flowing $O_2$, $N_2$ or Argon gas while operating at the first pressure between 1 Torr and 760 Torr; or utilizing a flash anneal process;

the flash anneal process comprises heating to a second temperature between 500 and 1300 degrees Celsius, for a second time duration of less than 10 millisecond, and at a second pressure between vacuum and 760 Torr;

the flash anneal process further comprises flowing $O_2$, $N_2$ or Argon gas while operating at the second pressure between 1 Torr and 760 Torr; or utilizing a laser anneal process;

the laser anneal process comprises heating to a third temperature of up to 1300 degrees Celsius, for a third time duration of less than 100 microseconds, and at a third pressure between vacuum and 760 Torr;

the laser anneal process further comprises flowing $O_2$, $N_2$ or Argon gas while operating at the third pressure between 1 Torr and 760 Torr; or utilizing a microwave anneal process, wherein the microwave anneal process comprises heating for a fourth time duration of less than 3600 s at a microwave power of less than 1000 W.

11. The method of claim 2, wherein the initial one or more targets utilized to deposit the dielectric layer comprises an element, a binary alloy or a compound of a form $F_xG_y$, or a ternary alloy or a compound of a form $F_xG_yH_z$, where F and G can be metals and H can be a non-metal like O.

12. The method of claim 1, wherein the tolerance level is within 5% of target values.

* * * * *